United States Patent
Chi et al.

(10) Patent No.: US 11,714,282 B2
(45) Date of Patent: Aug. 1, 2023

(54) COMPACT ARRAY LIGHT SOURCE FOR SCANNING DISPLAY

(71) Applicant: META PLATFORMS TECHNOLOGIES, LLC, Menlo Park, CA (US)

(72) Inventors: Wanli Chi, Sammamish, WA (US); Chadwick Brian Martin, Kirkland, WA (US); Scott Charles McEldowney, Redmond, WA (US); Maxwell Parsons, Berkeley, CA (US); Stephen James McNally, Sammamish, WA (US); Daniel Guenther Greif, Redmond, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 149 days.

(21) Appl. No.: 16/506,899

(22) Filed: Jul. 9, 2019

(65) Prior Publication Data
US 2020/0310122 A1 Oct. 1, 2020

Related U.S. Application Data

(60) Provisional application No. 62/854,477, filed on May 30, 2019, provisional application No. 62/826,678, filed on Mar. 29, 2019.

(51) Int. Cl.
*G02B 27/01* (2006.01)

(52) U.S. Cl.
CPC ..... *G02B 27/0172* (2013.01); *G02B 27/0176* (2013.01); *G02B 2027/0178* (2013.01)

(58) Field of Classification Search
CPC .... G02B 2027/0163; G02B 2027/0165; G02B 2027/0167; G02B 2027/0169;
(Continued)

(56) References Cited

U.S. PATENT DOCUMENTS

| 8,593,701 | B2 | 11/2013 | Soeda et al. |
| 2005/0264502 | A1 | 12/2005 | Sprague et al. |

(Continued)

FOREIGN PATENT DOCUMENTS

| CN | 105683810 A | 6/2016 |
| CN | 105900166 A | 8/2016 |

(Continued)

OTHER PUBLICATIONS

Cook M., "Osram Opto achieves Cyannitride Semiconductor Superluminescent LED—InGaNdevice Outputs more than 4mW of 500nm-Wavelength Light, Promising Application to Projectors," SemiconductorTODAY Compounds & Advanced Silicon, Oct. 2012, vol. 7 (8), 2 Pages.

(Continued)

*Primary Examiner* — Thomas K Pham
*Assistant Examiner* — Henry Duong
(74) *Attorney, Agent, or Firm* — Morgan, Lewis & Bockius LLP

(57) ABSTRACT

A light source includes a first set of source elements and a second set of source elements. A respective set of source elements is disposed on a respective substrate and electrically coupled to a respective set of circuit pads formed on a respective top surface of the respective substrate by respective bond wires. At least a portion of the respective top surfaces face each other and are spaced apart from each other to accommodate at least some of the first set of source elements, at least some of the second set of source elements, and at least some of the bond wires. The display device that includes a light source configured to output image light, an optical assembly configured to collimate the image light, a scanning assembly configured to steer the image light, and an output device configured to output the image light for displaying images is also disclosed.

20 Claims, 19 Drawing Sheets

(58) Field of Classification Search
CPC .... G02B 2027/0174; G02B 2027/0178; G02B 2027/0181; G02B 2027/0185; G02B 2027/0183; G02B 2027/0187; G02B 2027/019; G02B 2027/0192; G02B 2027/0194; G02B 2027/0196; G02B 2027/0198; G02B 2027/0125; G02B 2027/0127; G02B 2027/0129; G02B 2027/013; G02B 2027/0132; G02B 2027/0134; G02B 2027/0136; G02B 2027/0138; G02B 2027/014; G02B 2027/0141; G02B 2027/0143; G02B 2027/0145; G02B 2027/0147; G02B 2027/015; G02B 2027/0152; G02B 2027/0154; G02B 2027/0156; G02B 2027/0158; G02B 2027/0159; G02B 2027/0161; G02B 27/01; G02B 27/0101; G02B 27/0103; G02B 27/0149; G02B 27/017; G02B 27/0172; G02B 27/0176; G02B 27/0179; G02B 27/0189; G02B 2027/0105; G02B 2027/0107; G02B 2027/0109; G02B 2027/011; G02B 2027/0112; G02B 2027/0114; G02B 2027/0116; G02B 2027/0118; G02B 2027/012; G02B 2027/0121; G02B 2027/0123; G02B 26/105; G02B 27/0093; G02B 26/0833; H01L 25/167
USPC .......................................................... 359/630
See application file for complete search history.

(56) References Cited

U.S. PATENT DOCUMENTS

| | | | | |
|---|---|---|---|---|
| 2009/0040477 A1* | 2/2009 | Matsumoto | ........... | H01S 5/4025 353/94 |
| 2009/0128717 A1 | 5/2009 | Nagashima et al. | | |
| 2010/0315605 A1 | 12/2010 | Arita | | |
| 2010/0321781 A1* | 12/2010 | Levola | ............... | G02B 27/4205 359/569 |
| 2011/0058230 A1 | 3/2011 | Soeda et al. | | |
| 2011/0280267 A1* | 11/2011 | Yoshikawa | .......... | H04N 9/3161 372/44.01 |
| 2012/0275134 A1* | 11/2012 | Takahashi | ............. | H01S 5/4012 362/84 |
| 2016/0330418 A1 | 11/2016 | Nakai et al. | | |
| 2017/0257620 A1 | 9/2017 | Takeda et al. | | |
| 2020/0166754 A1* | 5/2020 | Leister | ................. | G02B 5/3083 |
| 2020/0209625 A1* | 7/2020 | Takeda | ............... | G02B 27/0172 |
| 2020/0278559 A1* | 9/2020 | Hamade | ................ | H01L 27/322 |

FOREIGN PATENT DOCUMENTS

| | | |
|---|---|---|
| CN | 106170729 A | 11/2016 |
| DE | 102013224420 A1 | 11/2014 |
| EP | 2023452 A2 | 2/2009 |
| EP | 2518560 A1 | 10/2012 |
| JP | 2000056410 A | 2/2000 |
| JP | 2007201285 A | 8/2007 |
| WO | 2019003546 A1 | 1/2019 |
| WO | WO-2019003546 A1 * | 1/2019 ............. H01S 5/022 |

OTHER PUBLICATIONS

International Search Report and Written Opinion for International Application No. PCT/US2020/021442, dated Jul. 31, 2020, 14 Pages.
International Search Report and Written Opinion for International Application No. PCT/US2020/024157, dated Jul. 3, 2020, 11 Pages.
Invitation to Pay Additional Fees for International Application No. PCT/US2020/021442, dated Jun. 8, 2020, 9 pages.
Office Action dated Feb. 15, 2023 for Chinese Application No. 202080025700.X, filed Sep. 28, 2021, 10 pages.
Office Action dated Jan. 5, 2023 for Chinese Application No. 202080024595.8, filed Sep. 26, 2021, 14 pages.

* cited by examiner

COMPACT ARRAY LIGHT SOURCE FOR SCANNING DISPLAY

RELATED APPLICATIONS

This application claims the benefit of, and priority to, U.S. Provisional Patent Application Ser. No. 62/826,678, filed Mar. 29, 2019 and U.S. Provisional Patent Application Ser. No. 62/854,477, filed May 30, 2019. All of these applications are incorporated by reference herein in their entireties.

TECHNICAL FIELD

This relates generally to display devices, and in particular, to compact array light source for scanning display devices.

BACKGROUND

Near-eye-display devices such as head-mounted display devices (also called herein near-eye displays or head-mounted displays) are gaining popularity as means for providing visual information to a user. For example, head-mounted display devices are used for virtual reality and augmented reality operations.

Compact displays are desired in near-eye display devices and head-mounted display devices. Since a display of a head-mounted display device is usually worn on the head of a user, a large, bulky, unbalanced, and/or heavy head-mounted display device would be cumbersome and may be uncomfortable for the user. Light sources can contribute to the size of near-eye display devices and head-mounted display devices. Thus, it may be desirable to use light sources that are compact in size and also provide a spectral range suitable for creating true colors when blended.

SUMMARY

Accordingly, there is a need for compact head-mounted display devices to provide a comfortable user experience with virtual reality and/or augmented reality operations.

The above deficiencies and other problems associated with conventional head-mounted displays are reduced or eliminated by the disclosed display devices.

In accordance with some embodiments, a light source includes a first set of source elements and a second set of source elements. The first set of source elements are disposed on a first substrate and electrically coupled to a first set of circuit pads formed on a first top surface of the first substrate by respective first bond wires. The second set of source elements are disposed on a second substrate and electrically coupled to a second set of circuit pads formed on a second top surface of the second substrate by respective second bond wires. At least a first portion of the first top surface and at least a portion of the second top surface face each other.

In accordance with some embodiments, a display device for displaying images includes a light source configured to output image light and an optical assembly configured to receive and collimate the image light output from the light source. The light source includes a first set of source elements and a second set of source elements. The first set of source elements are disposed on a first substrate and electrically coupled to a first set of circuit pads formed on a first top surface of the first substrate by respective first bond wires. The second set of source elements are disposed on a second substrate and electrically coupled to a second set of circuit pads formed on a second top surface of the second substrate by respective second bond wires. At least a first portion of the first top surface and at least a portion of the second top surface face each other.

Thus, the disclosed embodiments provide a compact light source that provides a spectral range suitable for creating true colors when blended.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

Figure 1:
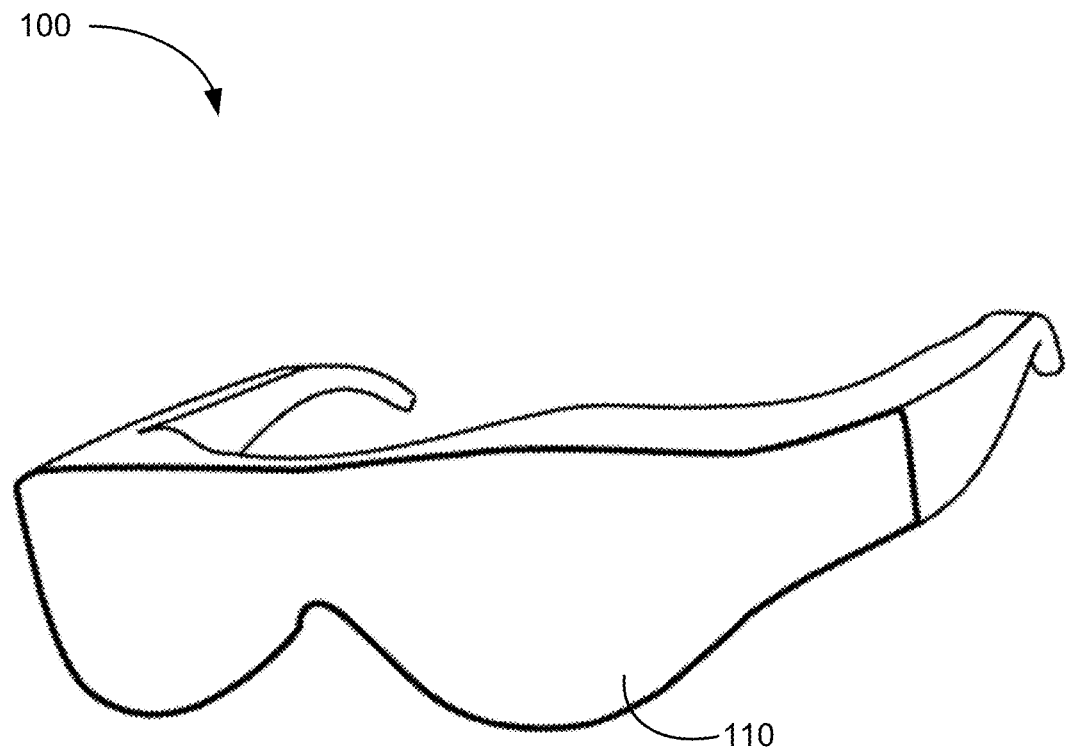
FIG. 1 is a perspective view of a display device in accordance with some embodiments.

These figures are not drawn to scale unless indicated otherwise.

DETAILED DESCRIPTION

The present disclosure provides a display device for displaying images. The display device includes a compact light source that includes source elements. The source elements are arranged to form a first set of source elements that are configured to output light having a first spectral range, a second set of source elements that are configured to output light having a second spectral range, and a third set of source elements that are configured to output light having a third spectral range. Thus, light output by the light source provides a spectral range that can be blended to provide true colors. In some embodiments, the light source is configured to output the light toward an optical assembly. In some embodiments, the optical assembly is configured to receive the light, having a first divergence, and output the light, having a second divergence, toward a scanning assembly, thereby collimating the light. In some embodiments, the scanning assembly is configured to redirect the light toward an eye of a user.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first light projector could be termed a second light projector, and, similarly, a second light projector could be termed a first light projector, without departing from the scope of the various described embodiments. The first light projector and the second light projector are both light projectors, but they are not the same light projector.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

Figure 2:
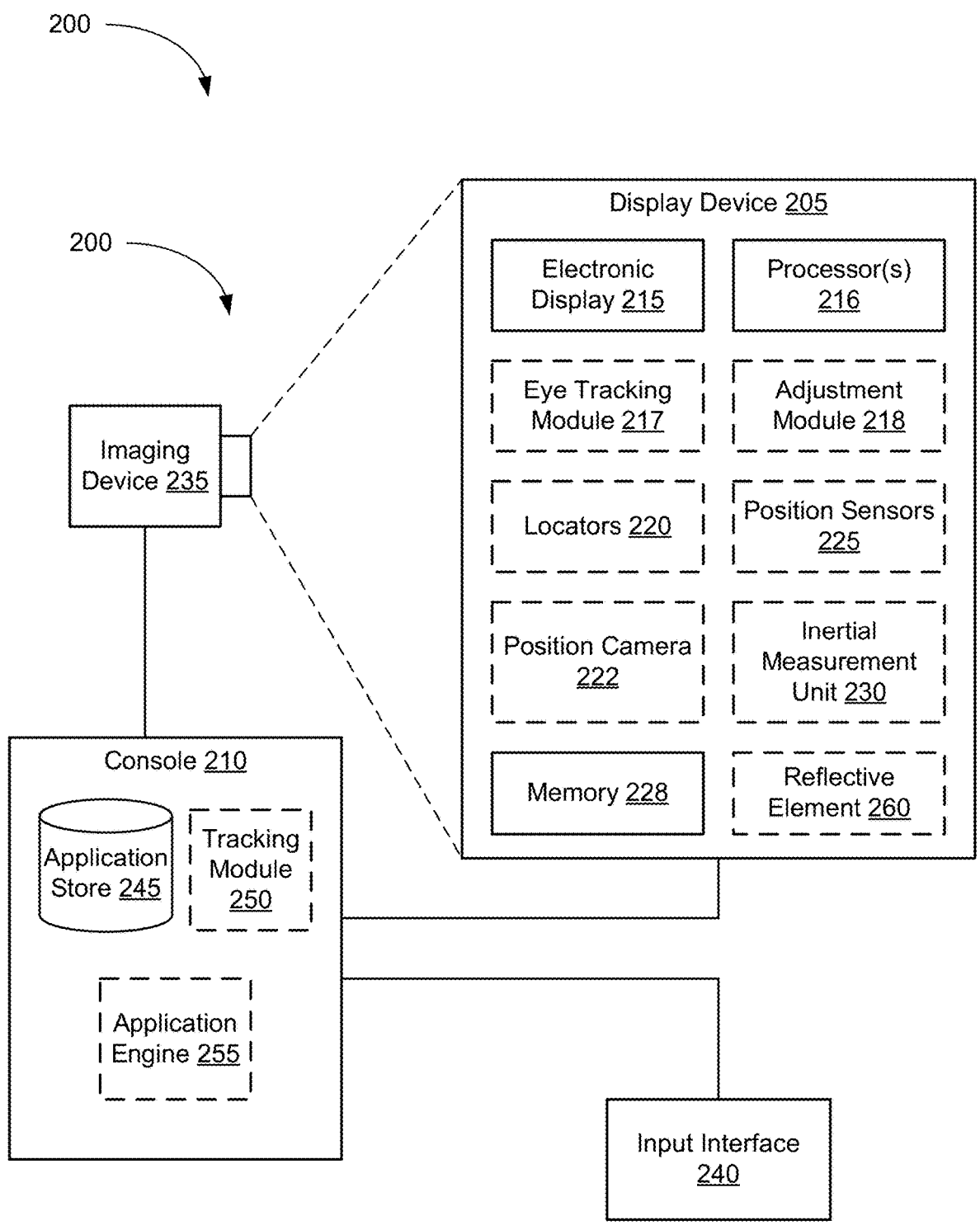
FIG. 2 is a block diagram of a system including a display device in accordance with some embodiments.

In some embodiments, display device 100 includes one or more components described herein with respect to FIG. 2. In some embodiments, display device 100 includes additional components not shown in FIG. 2.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver augmented reality, virtual reality, and/or mixed reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in an augmented environment.

In some embodiments, display device 205 acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, in some embodiments, display device 205 can operate as a virtual reality (VR) device, an augmented reality (AR) device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, one or more reflective elements 260 or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here or can be distributed to other computing devices in communication with display device 205.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable display element or multiple adjustable display elements (e.g., a display for each eye of a user). In some embodiments, electronic display 215 is configured to display images to the user by projecting the images onto one or more reflective elements 260.

In some embodiments, the display element includes one or more light emission devices and a corresponding array of spatial light modulators. A spatial light modulator is an array of electro-optic pixels, opto-electronic pixels, some other array of devices that dynamically adjust the amount of light transmitted by each device, or some combination thereof. These pixels are placed behind one or more lenses. In some embodiments, the spatial light modulator is an array of liquid crystal based pixels in an LCD (a Liquid Crystal Display). Examples of the light emission devices include: an organic light emitting diode (OLED), an active-matrix organic light-emitting diode, a light emitting diode (LED), some type of device capable of being placed in a flexible display, or some combination thereof. The light emission devices include devices that are capable of generating visible light (e.g., red, green, blue, etc.) used for image generation. The spatial light modulator is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array. In some embodiments, electronic display 215 projects images to one or more reflective elements 260, which reflect at least a portion of the light toward an eye of a user.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). As mentioned above, in some embodiments, system 200 may use other eye tracking systems than the embedded IR one described herein.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof. In some embodiments, adjustment module 218 includes one or more controllers configured to control one or more optical elements of display device 205. For example, a controller may be configured to dynamically adjust the shape of a deformable active element configured to steer light towards pupil 350 of eye 340 of a user.

Optional locators 220 are objects located in specific positions on display device 205 relative to one another and relative to a specific reference point on display device 205. A locator 220 may be an LED, a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

In some embodiments, display device 205 optionally includes one or more reflective elements 260. In some embodiments, electronic display device 205 optionally includes a single reflective element 260 or multiple reflective elements 260 (e.g., a reflective element 260 for each eye of a user). In some embodiments, electronic display 215 projects computer-generated images on one or more reflective elements 260, which, in turn, reflect the images toward an eye or eyes of a user. The computer-generated images include still images, animated images, and/or a combination thereof. The computer-generated images include objects that appear to be two-dimensional and/or three-dimensional objects. In some embodiments, one or more reflective elements 260 are partially transparent (e.g., the one or more reflective elements 260 have a transmittance of at least 15%, 20%, 25%, 30%, 35%, 40%, 45%, or 50%), which allows transmission of ambient light. In such embodiments, computer-generated images projected by electronic display 215 are superimposed with the transmitted ambient light (e.g., transmitted ambient image) to provide augmented reality images.

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described herein may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in an augmented environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
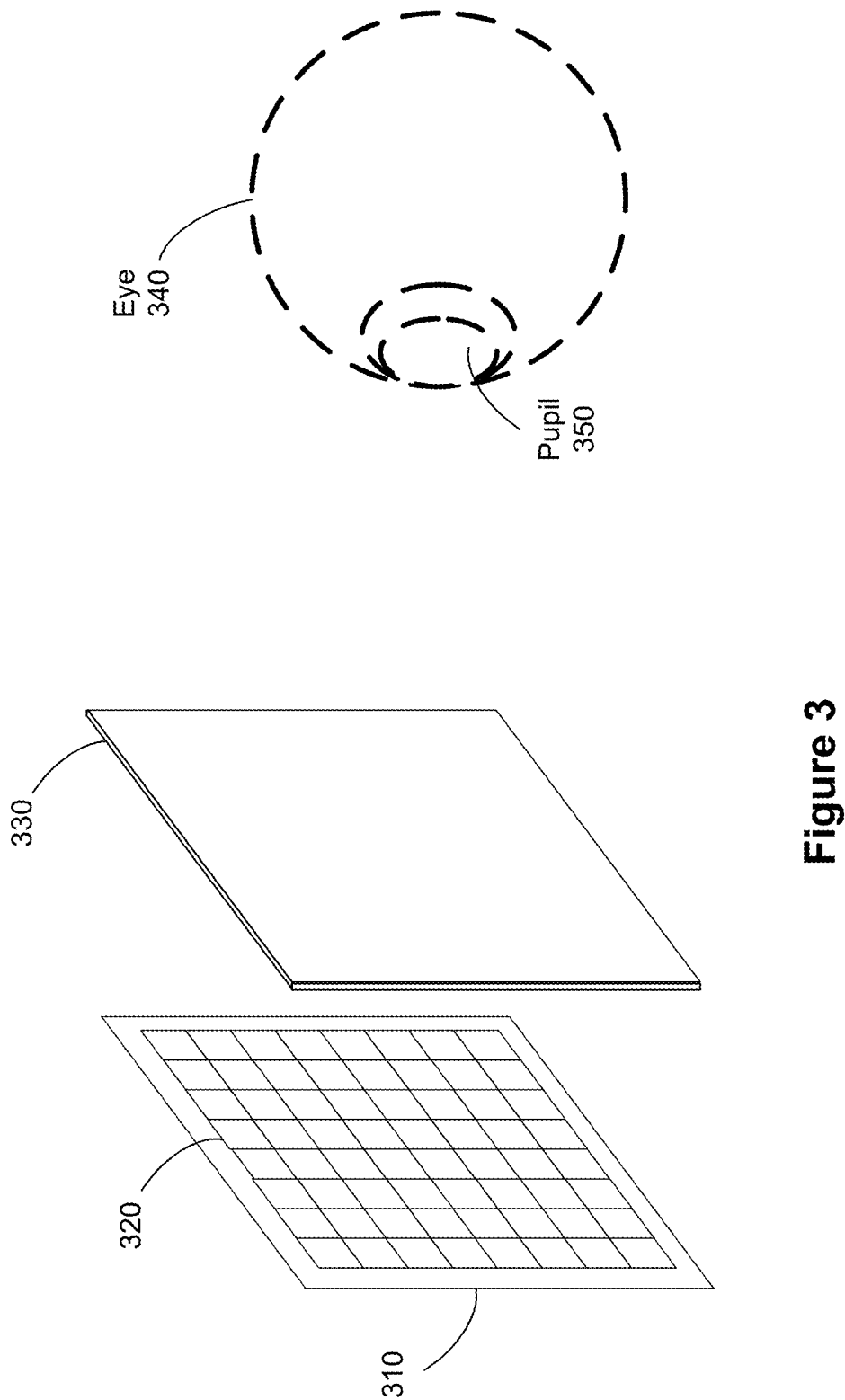
FIG. 3 is an isometric view of a display device in accordance with some embodiments.

FIG. 3 is an isometric view of display device 300 in accordance with some embodiments. In some other embodiments, display device 300 is part of some other electronic display (e.g., a digital microscope, a head-mounted display device, etc.). In some embodiments, display device 300 includes electronic display 310 and one or more lenses 330. In some embodiments, display device 300 also includes an IR detector array. In some embodiments, electronic display 310 corresponds to electronic display 215.

Electronic display 310 emits image light and optional IR light toward the viewing user. Electronic display 310 may be, e.g., an array of LEDs, an array of microLEDs, an array of OLEDs, or some combination thereof. Electronic display 310 includes light emission devices 320 that emit light in the visible light (and optionally includes devices that emit light in the IR).

In some embodiments, display device 300 includes an emission intensity array configured to selectively attenuate light emitted from electronic display 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner, the emission intensity array is able to control what portion of the image light emitted from electronic display 310 is passed to the one or more lenses 330. In some embodiments, display device 300 uses an emission intensity array to facilitate providing image light to a location of pupil 350 of eye 340 of a user, and minimize the amount of image light provided to other areas in the eyebox.

One or more lenses 330 receive the modified image light (e.g., attenuated light) from emission intensity array (or directly from electronic display 310), and direct the modified image light to a location of pupil 350.

An optional IR detector array detects IR light that has been retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from electronic display 310. In some embodiments, the IR detector array is integrated into electronic display 310.

In some embodiments, electronic display 310 and an emission intensity array make up a display element. Alternatively, the display element includes electronic display 310 (e.g., when electronic display 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

In some embodiments, display device 300 includes one or more broadband sources (e.g., one or more white LEDs) coupled with a plurality of color filters, in addition to, or instead of, electronic display 310.

Figure 4:
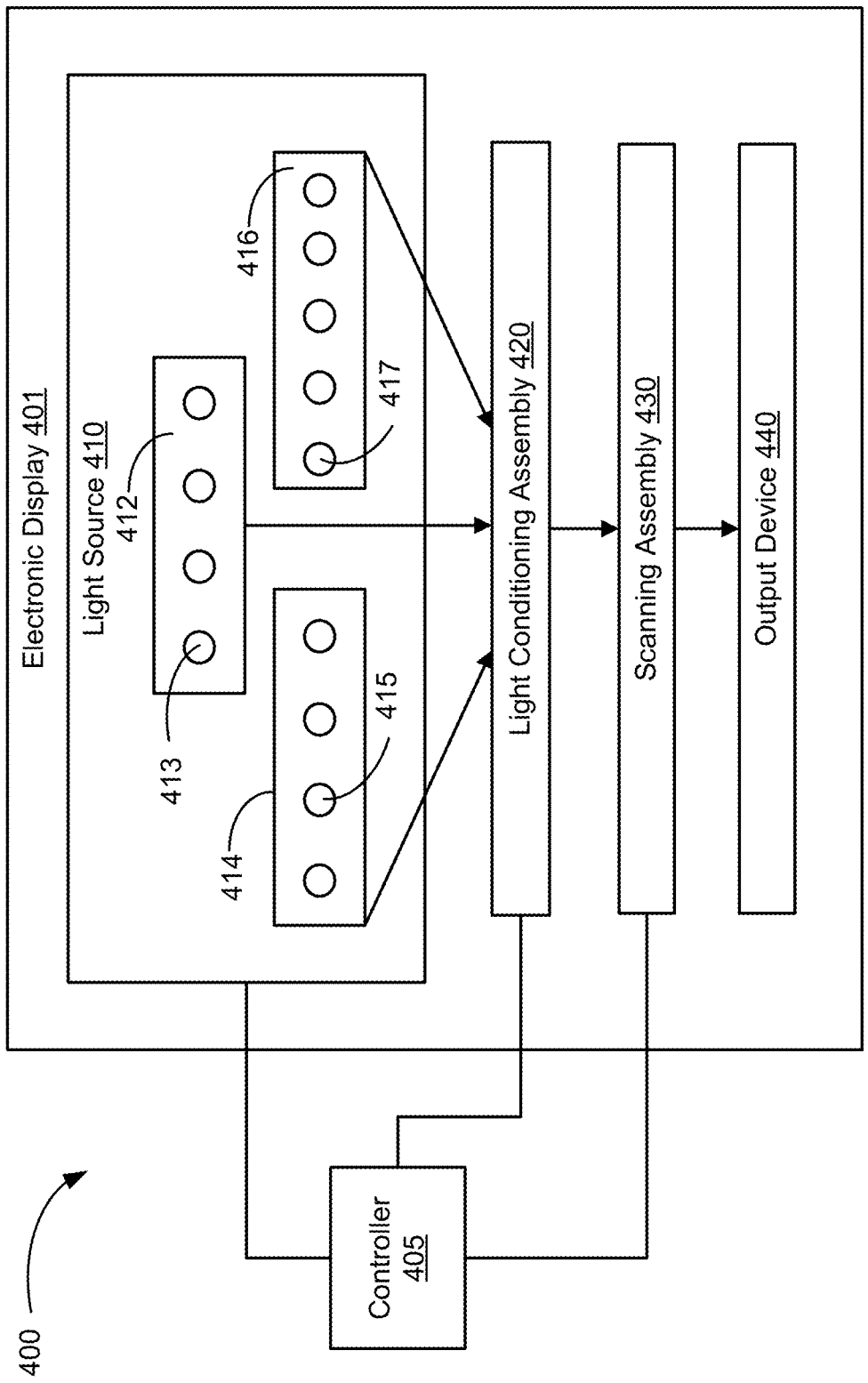
FIG. 4 is a block diagram of a display device in accordance with some embodiments.

FIG. 4 illustrates a block diagram of display device 400, corresponding to electronic display 310, for displaying images in accordance with some embodiments. As shown, display device 400 includes electronic display 401 and controller 405. Electronic display 401 includes light source 410, light conditioning assembly 420, scanning assembly 430, and output device 440. Light source 410 is configured to output light. Light conditioning assembly 420 is configured to receive and collimate the light output from light source 410. Scanning assembly 430 is configured to receive light output from light conditioning assembly 420 in a first direction and steer the light across a range of directions. Controller 405 includes one or more controllers that are configured to control one or more of light source 410 and scanning assembly 430.

Light source 410 includes a plurality of source elements that generate image light corresponding to one or more images to be displayed. In certain embodiments, light source 410 includes one or more source element packages (e.g., first source element package 412, second source element package 414, third source element package 416). Each source element package includes one or more source elements. For example, as shown, first source element package 412 includes a first set of source elements 413, second source element package 414 includes a second set of source elements 415, and third source element package 416 includes a third set of source elements 417. In some embodiments, the source element packages may have a different number of source elements from one another. For example, as shown, first source element package 412 includes four source elements and third source element package includes five source elements. Alternatively, the source element packages may each have the same number of source elements. Examples of source elements include: OLEDs, active-matrix organic light-emitting diodes, LEDs, super luminescent light emitting diodes (sLEDs), or some type of device capable of being placed in a flexible display, or some combination thereof, capable of generating visible light (e.g., red, green, blue, etc.) used for image generation. In some embodiments, source elements 413, 415, and 417 of light source 410 are edge-emitting devices such as sLEDs. In some embodiments, source elements 413, 415, and 417 of light source 410 are lasers, such as vertical cavity surface emitting lasers (VCSELs) or edge-emitting lasers.

In some cases, source elements of a respective set emit light having a respective spectral range. For example, source elements 413 may be configured to output light having a wavelength that is within a first spectral range (e.g., corresponding to red). Source elements 415 may be configured to output light having a wavelength that is within a second spectral range (e.g., corresponding to green) that is different from the first spectral range. Source elements 417 may be configured to output light having a wavelength that is within a third spectral range (e.g., corresponding to blue) that is different from each of the first and second spectral ranges. In some embodiments, all of the source elements of a source element package may be configured to emit light having the same optical characteristics. For example, source elements 413 of first source element package 412 may all emit light having the same center wavelength and the same bandwidth at the same intensity. Alternatively, each source element of a source element package may be configured to emit light having different optical characteristics compared to the other source elements of the same source element package. For example, different source elements may be configured to emit light having different center wavelengths (e.g., the center wavelengths are offset by 0.5 nm, 1 nm, 1.5 nm, 2 nm, etc.) and/or different bandwidths (e.g., the bandwidths differ by 1 nm, 2 nm, 3 nm, 5 nm, 10 nm, 15 nm, 20 nm, etc.) in order to reduce coherence artifacts. In some cases, the image light output from light source 410 is adjusted by light conditioning assembly 420.

Light conditioning assembly 420 is configured to receive image light output from light source 410 and to output conditioned light toward scanning assembly 430. Conditioned light is light that has been conditioned for incidence on scanning assembly 430. In some embodiments, light conditioning assembly 420 includes one or more optical elements (e.g., a prism or lens) configured to condition the light output from the light source. Conditioning light output from the light source may include, e.g., expanding, collimating, correcting for one or more optical errors (e.g., field curvature, chromatic aberration, etc.), some other adjustment of the light, or some combination thereof. For example, light source 410 may output image light having a first divergence and light conditioning assembly 420 may condition the image light and output conditioned light that has a second divergence that is different from the first divergence. For instance, light conditioning assembly 420 may collimate the image light such that the conditioned light output from light conditioning assembly 420 is substantially collimated compared to the image light output from light source 410.

Scanning assembly 430 is configured to receive the conditioned light and steer the conditioned light toward output device 440. Scanning assembly 430 may include one or more reflective elements, such as a micro-electro-mechanical system (MEMS) mirror or a deformable mirror. In such cases, the conditioned light is steered based on specific orientations of the one or more reflective elements (e.g., the surface orientation of a MEMS mirror), which is part of a MEMS chip controlled by controller 405. For example, for scanning in two dimensions (e.g., x-direction and y-direction), scanning assembly 430 may include a two-dimensional MEMS mirror or two one-dimensional MEMS mirrors that cooperatively work to steer the conditioned light toward output device 440.

Output device 440 is configured to receive the steered light from scanning assembly 430 and to output the steered light as output light. Output device 440 may include a waveguide that receives and directs the steered light as output light to an eye of a user.

Controller 405 is configured to control light source 410, light conditioning assembly 420, and scanning assembly 430 in order for electronic display 401 to output light corresponding to one or more images to be displayed. In some embodiments, controller 405 controls the scanning operations of electronic display 401. Controller 405 determines scanning instructions for light source 410 based at least on the one or more display instructions from console 210. Display instructions are instructions to render one or more images. In some embodiments, display instructions may simply be an image file (e.g., bitmap). Scanning instructions are instructions used by light source 410 to generate image light. The scanning instructions may include, e.g., a type of a source of image light (e.g. monochromatic, polychromatic), a scanning rate, an orientation of a scanning mirror assembly, one or more illumination parameters, or some combination thereof. Controller 405 includes a combination of hardware, software, and/or firmware not shown here so as not to obscure other aspects of the disclosure.

Figure 5:
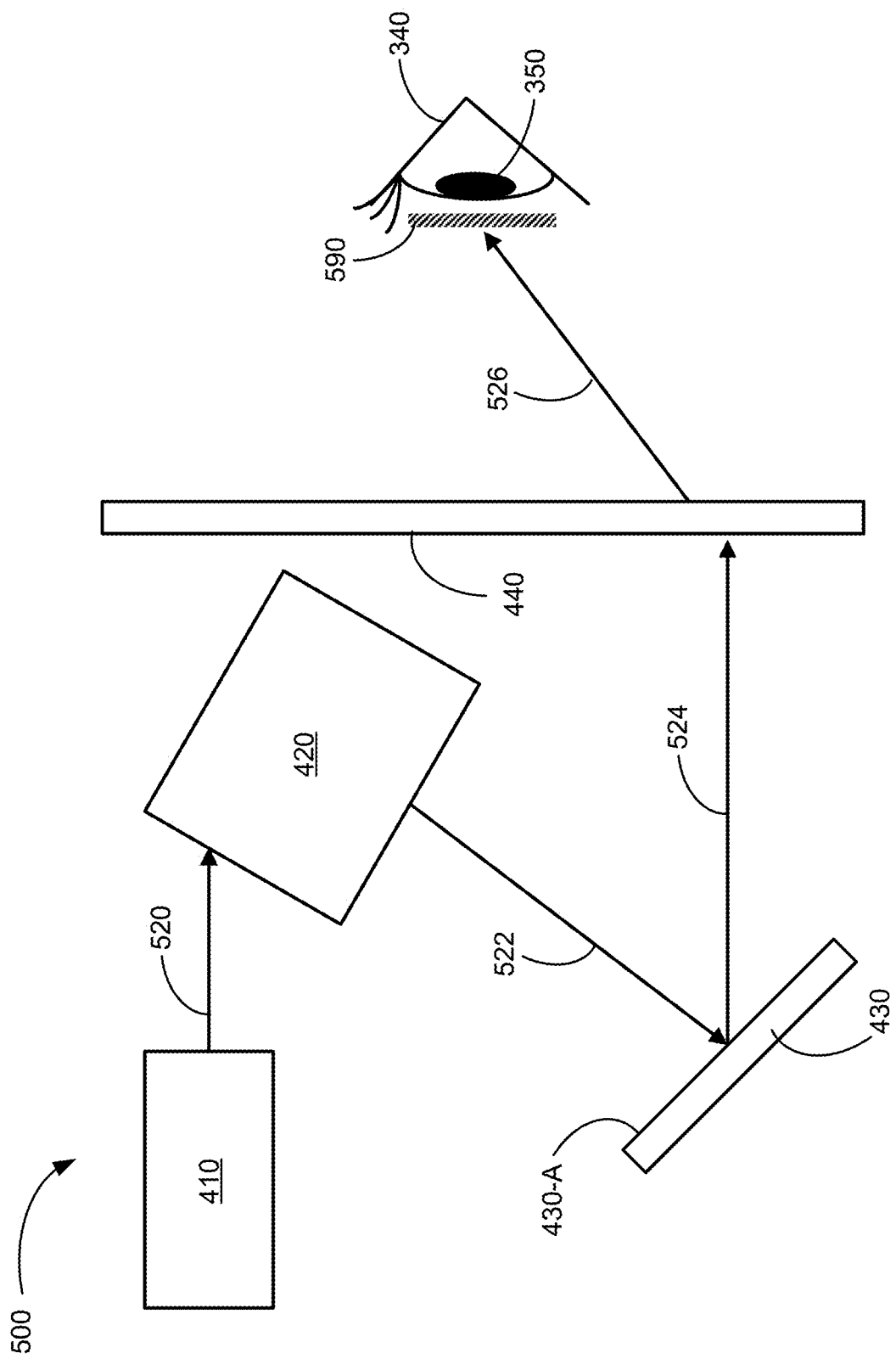
FIG. 5 illustrates a display device in accordance with some embodiments.

FIG. 5 illustrates a display device 500, corresponding to display device 400, in accordance with some embodiments. Display device 500 includes light source 410, light conditioning assembly 420, scanning assembly 430, and output device 440. Light source 410 is configured to output image light 520, corresponding to one or more images to be displayed. Light conditioning assembly 420 is configured to receive and condition (e.g., substantially collimate) image light 520 as conditioned light 522. Conditioned light 522 is output from light conditioning assembly 420 toward a surface 430-A of scanning assembly 430. Scanning assembly 430 is configured to redirect conditioned light 522 as steered light 524 toward output device 440. Output device 440 is configured to receive steered light 524 from scanning assembly 430 and to direct steered light 524 as output light 526, corresponding to the one or more images to be displayed, toward eyebox 590. Thus, image light 520, output from light source 410 and corresponding to one or more images, is transmitted to eyebox 590 as output light 526, displaying the one or more images.

Figure 6B:
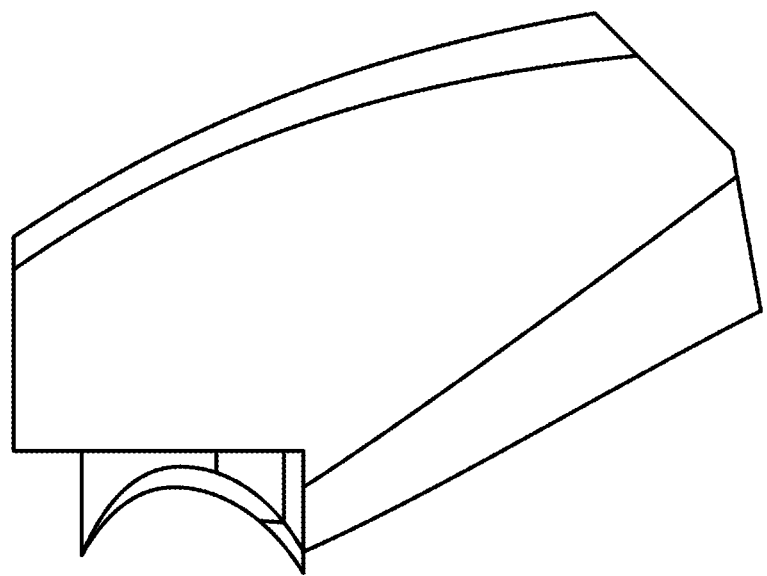
FIGS. 6A-6B illustrate a light conditioning assembly in a display device in accordance with some embodiments.
Figure 6A:
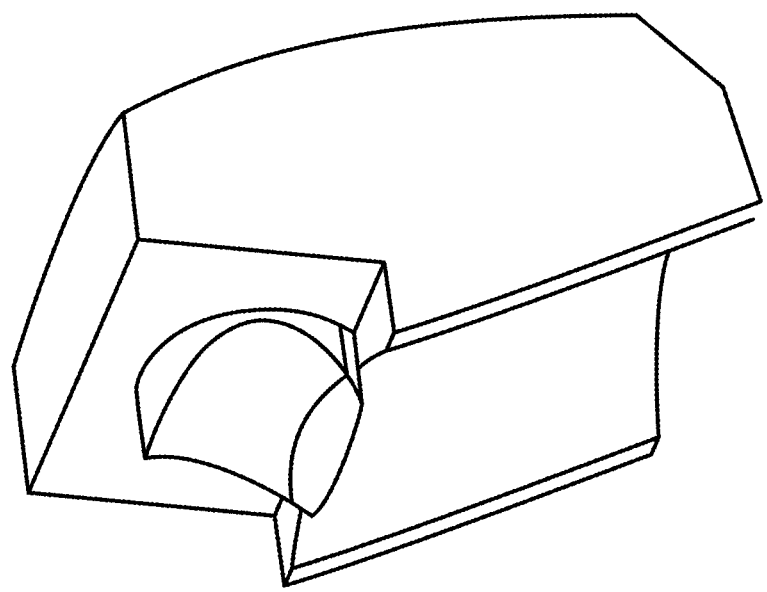

FIGS. 6A and 6B illustrate a perspective view and a side view, respectively, of a light conditioning assembly in accordance with some embodiments. Light conditioning assembly 420 includes one or more optical elements configured to receive and collimate light output from the one or more source element packages of light source 410. In some embodiments, light conditioning assembly 420 may include one or more optical elements. The one or more optical elements may be any of the following: lenses, folded mirror, prism, and powered mirror (e.g., freeform powered mirror). In some embodiments, the one or more optical elements may include one or more of an XY polynomial prism, a Zernike prism, and a freeform prism. In some embodiments, the one or more optical element may include a non-symmetric surface such as a decentered (e.g., tiled) surface, an anamorphic aspherical surface, or a polynomial surface. In some embodiments, when the one or more optical elements includes a prism, a fold angle of the prism can be adjusted or adapted to meet packaging needs (e.g., for compact packaging).

The angle at which conditioned light, output from light conditioning assembly 420, impinges onto surface 430-A of scanning assembly 430 can be adjusted based on the design and geometry of the one or more optical elements of light conditioning assembly 420.

Scanning assembly 430 may include a deformable optical element/component (e.g., MEMs, deformable mirror) and/or one or more reflective elements or scanning mirror (e.g., MEMS mirror) that is configured to scan in at least two dimensions. Scanning assembly 430 may be configured to scan light in two dimensions in order to display and present one or more images to an eyebox 590 via output device 440. Alternatively, scanning assembly 430 may include a plurality of scanning mirrors (e.g., mirror galvanometer) that each scan in orthogonal directions to each other. Scanning assembly 430 may be configured to perform a raster scan (horizontally or vertically) or a sinusoidal scan (e.g., sinusoidal motion along the horizontal and vertical axes, shown in FIG. 7, also known as biresonant scanning). In some embodiments, scanning assembly 430 may perform a controlled vibration along the horizontal and/or vertical directions with a specific frequency of oscillation to scan along two dimensions and generate a two-dimensional projected line image of the media presented to the user's eyes. For example, scanning assembly 430 may undergo an oscillation with a peak-to-peak amplitude of a few hundreds of nanometers per second along the vertical direction based on the desired frequency of oscillation. For example, steered light 524, output from scanning assembly 430 may be scanned in one or more directions toward output device 440. Scanning assembly 430 outputs steered light 524 at a particular orientation (in accordance with the scanning instructions) toward output device 440. For example, a galvanometer mirror of scanning assembly 430 may represent any electromechanical instrument that indicates that it has sensed an electric current by deflecting a beam of image light with one or more mirrors. The galvanometer mirror may be configured to scan in at least one orthogonal dimension to generate the steered light 524. Steered light 524, output from the galvanometer mirror, represents a two-dimensional line image of the media presented to the user's eyes.

In some embodiments, scanning assembly 430 is configured to receive conditioned light 522, output from light conditioning assembly 420, in a first direction and direct (e.g., steer or scan) conditioned light 522 as steered light 524 in a range of directions. In some embodiments, scanning assembly 430 is configured to, at a first time, steer conditioned light 522, incident on scanning assembly 430 in a third direction, as steered light 524, such that output light 526 is output from output device 440 in a fourth direction. The scanning assembly is also configured to, at a second time, steer conditioned light 522, incident on scanning assembly in a fifth direction, as steered light 524, such that output light 526 is output from output device 440 in a sixth direction. In some embodiments, the fifth direction is different from the third direction and the sixth direction is different from the fourth direction.

In some embodiments, output device 440 includes a waveguide. In such cases, scanning assembly 430 is configured to direct conditioned light 522 as steered light 524 such that steered light 524 is coupled into the waveguide of output device 440. In some embodiments, output device 440 receives steered light 524 at one or more coupling elements (e.g., an input element or input portion, now shown), and guides the steered light 524 to one or more decoupling elements (e.g., an output element or output port, not shown). In some embodiments, the coupling element couples steered light 524, received from scanning assembly 430 into a waveguide of output device 440. The coupling element may be, for example, a diffraction grating, a holographic grating, some other element that couples light into output device 440 or a waveguide of output device 440, or some combination thereof. For example, in embodiments where the coupling element is a diffraction grating, the pitch of the diffraction grating is chosen such that light is coupled into the waveguide at an angle (e.g., an angle that is no greater than a critical angle) that allows total internal reflection to occur and the light propagates within the waveguide toward the decoupling element. For example, the pitch of the diffraction grating may be in the range of 300 nm to 600 nm. As another example, light may be coupled into the waveguide at a waveguide opening. For example, steered light 524 may be coupled into the waveguide at an angle such that steered light 524 experiences total internal reflection and is propagated along the waveguide. The decoupling element decouples the total internally reflected light out of the waveguide. The decoupling element may be, e.g., a diffraction grating, a holographic grating, some other element that decouples image light out of the output waveguide, or some combination thereof. For example, in embodiments where the decoupling element is a diffraction grating, the pitch of the diffraction grating is chosen to cause light propagating in the waveguide, corresponding to steered light 524 received at the coupling element, to exit the waveguide of output device 440 as output light 526. An orientation and position of output light 526 exiting from the waveguide is controlled by changing an orientation and position of steered light 524 entering the coupling element. For example, the pitch of the diffraction grating may be in the range of 300 nm to 600 nm. When output device 440 includes a waveguide, the waveguide may be composed of one or more materials that facilitate total internal reflection of light. The waveguide may be composed of e.g., silicon, plastic, glass, or polymers, or some combination thereof. The waveguide has a relatively small form factor for a head-mounted display. For example, the waveguide may be approximately 50 mm wide along the x-dimension, 30 mm long along the-dimension and between 0.5 mm and 1 mm thick along the z-dimension. In some embodiments, the waveguide is a 2D optical waveguide. Additionally, one or more of the coupling or decoupling elements may be located on a surface of the waveguide or integrated into the waveguide.

Controller 405 is configured to control light source 410 and/or scanning assembly 430. In some embodiments, controller 405 takes images for display from the console 210 and divides each image into discrete sections. Controller 405 instructs light source 410 to sequentially present the discrete sections. Controller 405 instructs scanning assembly 430 to scan the presented discrete sections to different areas of a coupling element of output device 440. Accordingly, at the exit pupil of output device 440, the discrete sections are scanned across different sections of the coupling elements. While each discrete section is presented at different times, the presentation and scanning of the discrete sections occurs fast enough that a user's eye integrates the different sections into a single image or series of images.

Figure 7:
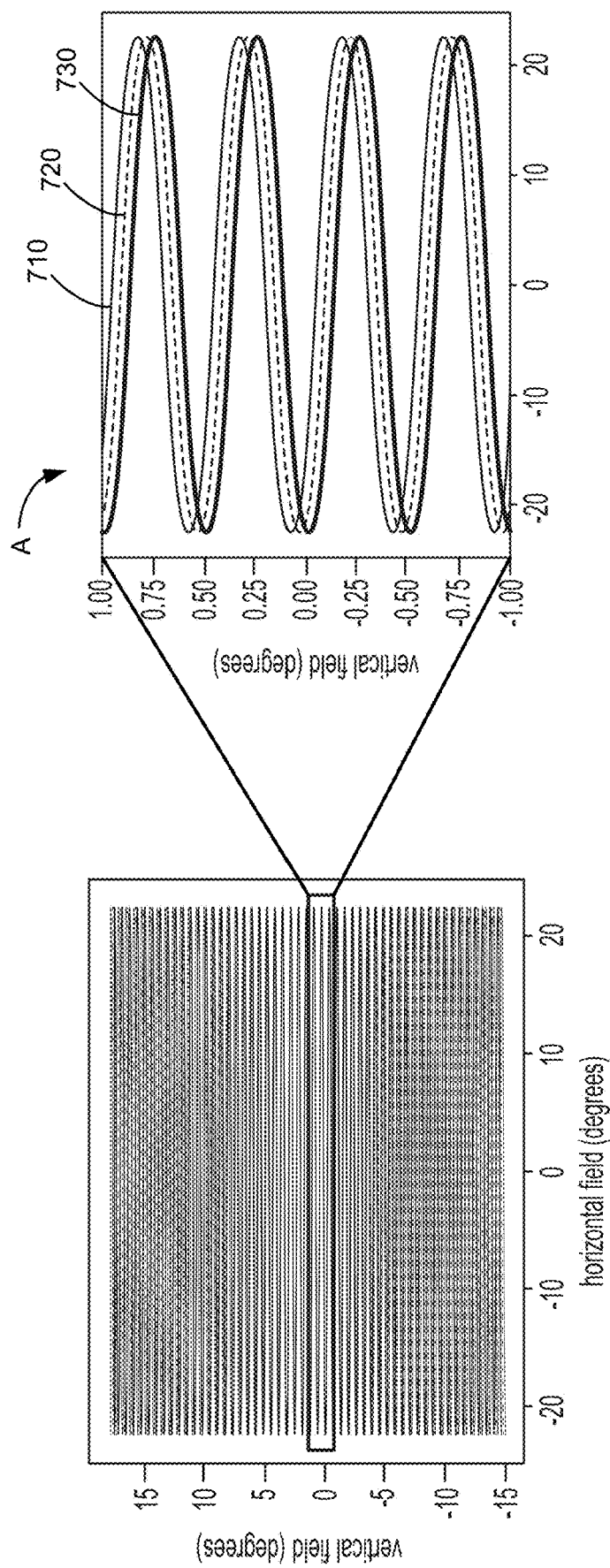
FIG. 7 shows a scanning display device in accordance with some embodiments.

For example, in embodiments where each source element package (e.g., first source element package 412, second source element package 414, and third source element package 416) includes a linear one-dimensional array of source elements, the content is divided by controller 405 into lines where the lines are scanned out to different areas of the coupling element of output device 440, such that, at an exit port (e.g., exit location, output coupler, decoupler) of output device 440, the lines are presented at different locations, which a user's eye integrates into a single image or series of images. FIG. 7 illustrates a scanning display device that includes at least three different source element packages, each emitting light of a different wavelength (e.g., outputting at least three different colors). Inset A shows an elongated view of a scanning pattern of the scanning display device. When scanning display device is in use, solid line 710, dashed line 720, and thick solid line 730, each corresponding to a different wavelength range (e.g., color), are scanned across a display surface in order to form images to be displayed to a user. In some embodiments, to have a frame rate that is higher than the standard display frame rate of 60 Hz, each source element package includes six source elements, and scanning assembly is able to scan at a resonant frequency of 10.5 kilohertz (kHz) and a duty cycle of 0.75, resulting in a frame rate of 100 frames per second (fps) and a resolution of 945 lines in each frame. Thus, higher frame rate and/or resolution can be achieved with an increased number of source elements in each source element package.

Figure 8A:
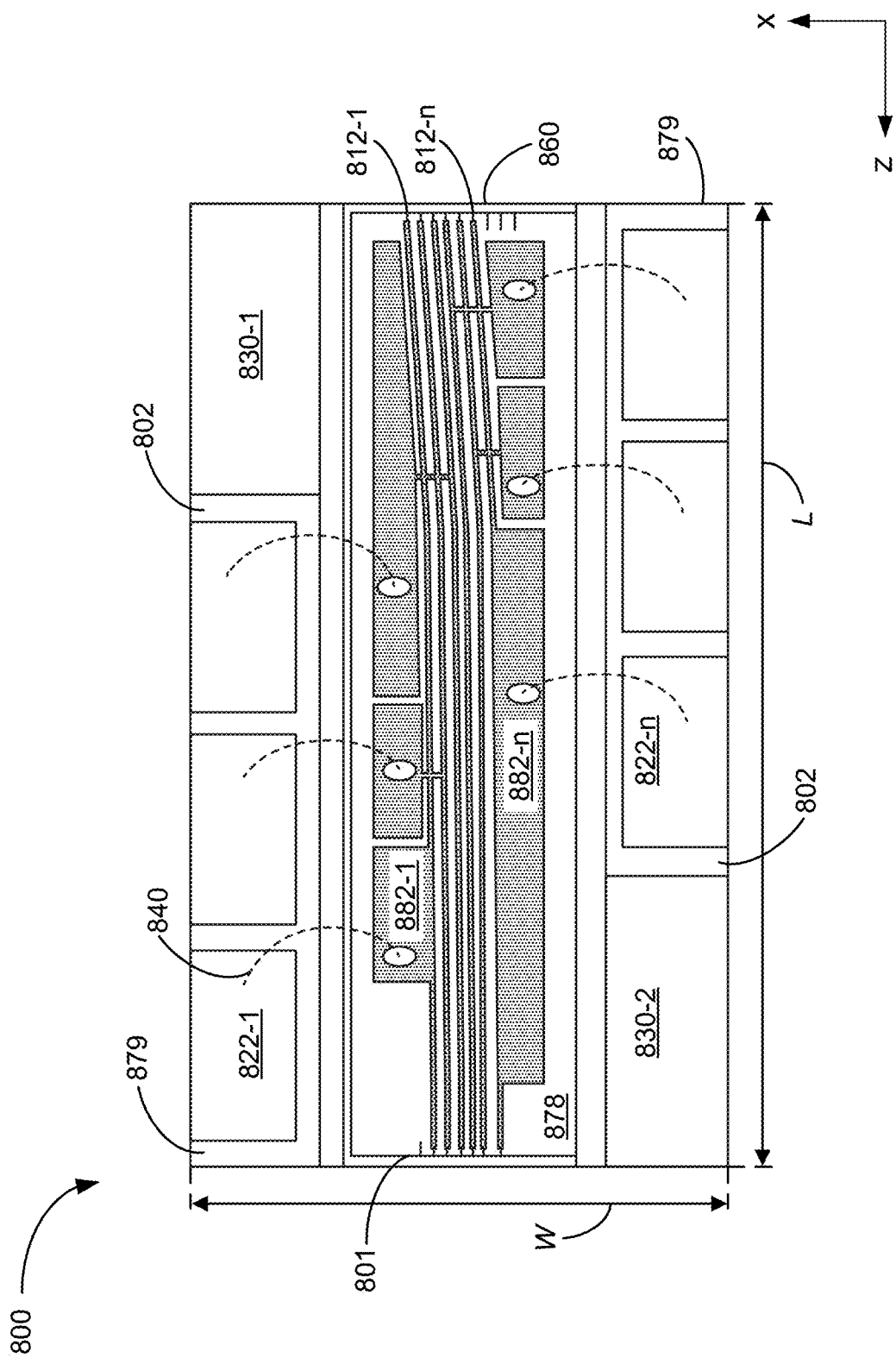
FIG. 8A illustrates an sLED chip of a display device in accordance with some embodiments.
Figure 8B:
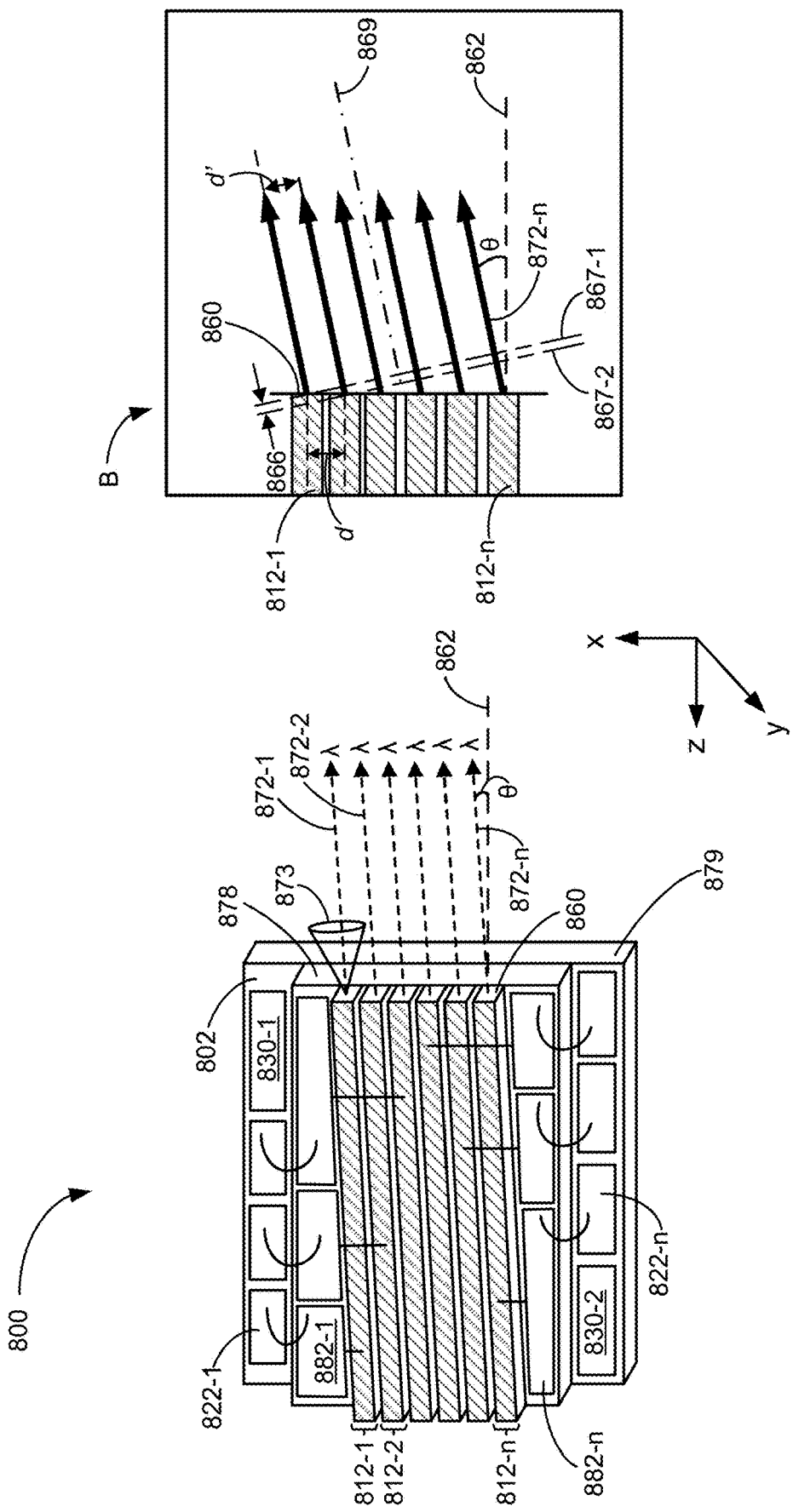
FIGS. 8B and 8C show perspective views of an sLED chip of a display device in accordance with some embodiments.
Figure 8C:
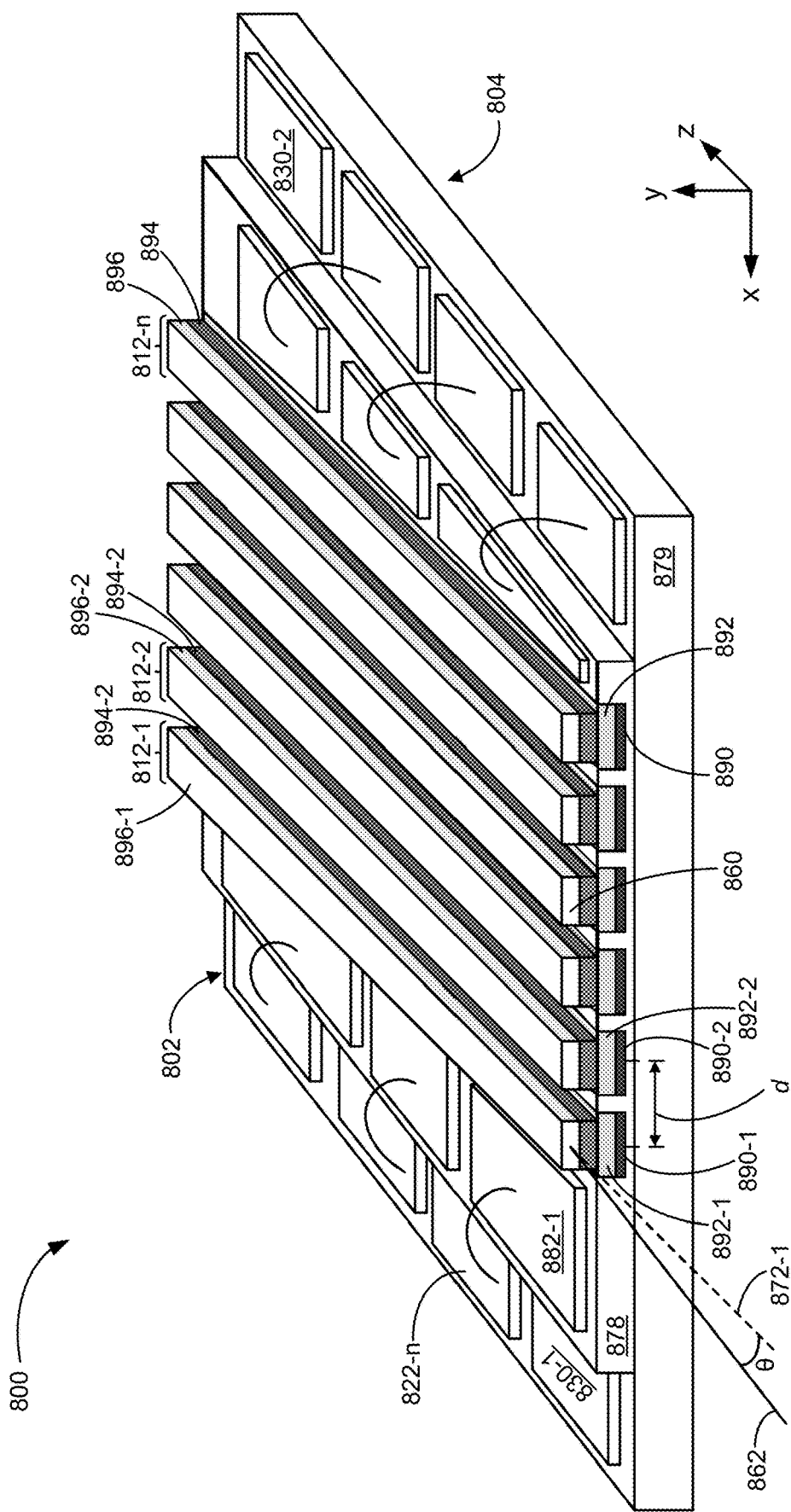

FIGS. 8A, 8B and 8C illustrate a top view, a first perspective view, and a second perspective view, respectively, of a source element package 800, corresponding to source element package 412, 414, or 416 of display device 400, in accordance with some embodiments. As shown, source element package 800 includes an sLED chip 801 mounted on a top side of a package substrate 879. Source element package 800 includes a plurality of sLEDs (e.g., sLEDs 812-1, . . . , 812-n, referred to hereafter collectively or individually as sLED 812), corresponding to the source elements on source element package 412, 414, or 416. The sLEDs 812 can be formed on a chip substrate 878 of the same sLED chip 801. Although six sLEDs are shown in FIG. 8A, one of ordinary skill in the art would understand that any number of sLEDs may be included on sLED chip 801.

Source element package 800 has a length L and a width W. In some embodiments, sLEDs 812 on the same sLED chip 801 output light having the same spectral range (e.g., they emit light having the same color range or wavelength range). In some embodiments, as shown, package substrate 879 has a plurality of circuit pads (e.g., circuit pads 822-1, . . . , 822-n, referred to hereafter individually or collectively as circuit pads 822) that are formed on a top surface 802 at the top side of package substrate 879. Each respective sLED 812 is coupled to a respective contact pad (e.g., contact pads 882-1, . . . , 882-n, referred to hereafter individually or collectively as contact pads 882) formed on sLED chip 801. A respective contact pad (e.g., 882-1) is connected to a respective circuit pad (e.g., circuit pad 822-1), by a respective bond wire 840. In some cases, source element package 800 includes an electrical ground pad 830-1 and an electrical power pad 830-2 also formed on the top surface 802 at the top side of package substrate 879.

In some embodiments, as shown, each sLED 812 is an edge-emitting device that emits light as a diverging beam from an output or emission surface 860, as shown by cone 873 in FIG. 8B. The emitted light from each sLED 812 is represented in FIG. 8B by a respective chief ray 872, from emission surface 860. For example, first sLED 812-1 is configured to emit light corresponding to chief ray 872-1 and second sLED 812-2 is configured to emit light corresponding to chief ray 872-2. Chief ray 872 can be, for example, a center ray in the diverging beam represented by cone 873. In some embodiments, light output from a sLED 812 may or may not have a symmetrical spatial profile (e.g., beam 837 may or may not be axially symmetric with respect to the corresponding chief ray 872). In some embodiments, light output from a sLED 812 has an asymmetrical spatial profile. In some embodiments, light output from sLED 812 diverges in an elliptical manner.

Inset B of FIG. 8B illustrates a zoomed in view of an emission surface 860. SLEDs 812 are arranged on chip substrate 878 such that chief rays 872 output from adjacent sLEDs 812 are spaced apart by distance d'. In some embodiments, a respective chief ray 872 output from a respective sLED 812 forms an angle $\theta$ relative to a normal 862 to emission surface 860. As a result, distance d' can be different from a distance d between centers of adjacent sLEDs 812.

In some embodiments, the direction of the emitted light is represented by optical axis 869 (e.g., chief ray 872 propagates along optical axis 869), and each sLED 812 can be represented by an optical plane 867 that is perpendicular to the optical axis 869 and intersect with the chief ray at an output of the sLED 812. For example, first sLED 812-1 may emit chief ray 872-1 in a direction that is parallel to optical axis 869 and normal to a first optical plane 867-1. Second sLED 812-2 may emit chief ray 872-2 in a direction that is parallel to optical axis 869 and normal to second optical plane 867-2. First optical plane 867-1 and second optical plane 867-2 are substantially parallel (e.g., forming an angle less than 1 degree) and separated by distance 866.

In some embodiments, sLEDs emit broadband light (e.g., light with a relatively broad or wide optical spectrum as compared to laser) and with a relatively well-defined beam direction (shown by chief ray 872-1) as compared to LEDs. Thus, sLEDs can be understood as broadband laser diodes with an incoherent beam-like output. In some embodiments, broadband light may be desirable (compared to narrow-band light such as light output from a laser) for color blending in display devices.

In some embodiments, as shown in FIG. 8C, an exemplary sLED 812 includes a diode having a positive p-doped section 890 coupled a respective ground pad 830, a negative n-doped section 894 coupled to a respective contact pad 882, and an active region 892 located between p-doped section 890 and n-doped section 894. A waveguide 896 is formed on the negative n-doped section 894 to guide the light generated in the active region 892 toward the emission surface. In some embodiments, as shown, the p-doped section 890 and active region 892 are formed on chip substrate 878. When the diode is positively biased, electrical current flows from p-doped section 890 to n-doped section 894 across active region 892. During this process, light is generated in active region 892 through spontaneous and random recombination of positive (e.g., holes) and negative (e.g., electrons) electrical carriers, and the light is amplified when travelling along the waveguide 896 of the sLED. The light is output at emission surface 860 which is also an output surface of waveguide 896. The sLED waveguide 896 is arranged at an angle $\theta$ relative to a normal 862 to emission surface 860 in order to prevent lasing or stimulated emission, which would result in narrowing of the bandwidth (e.g., spectrum) of the output light. In some embodiments, as shown, a first p-doped section 890-1 and a first active region 892-1 of a first sLED 812-1 are separated from a second p-doped section 890-2 and a second active region 892-2 of a second sLED 812-2 that is adjacent to first sLED 812-1. In some embodiments, this separation is related to a minimum distance requirement between two adjacent sLEDs of the same chip and corresponds to distance d.

Figure 9A:
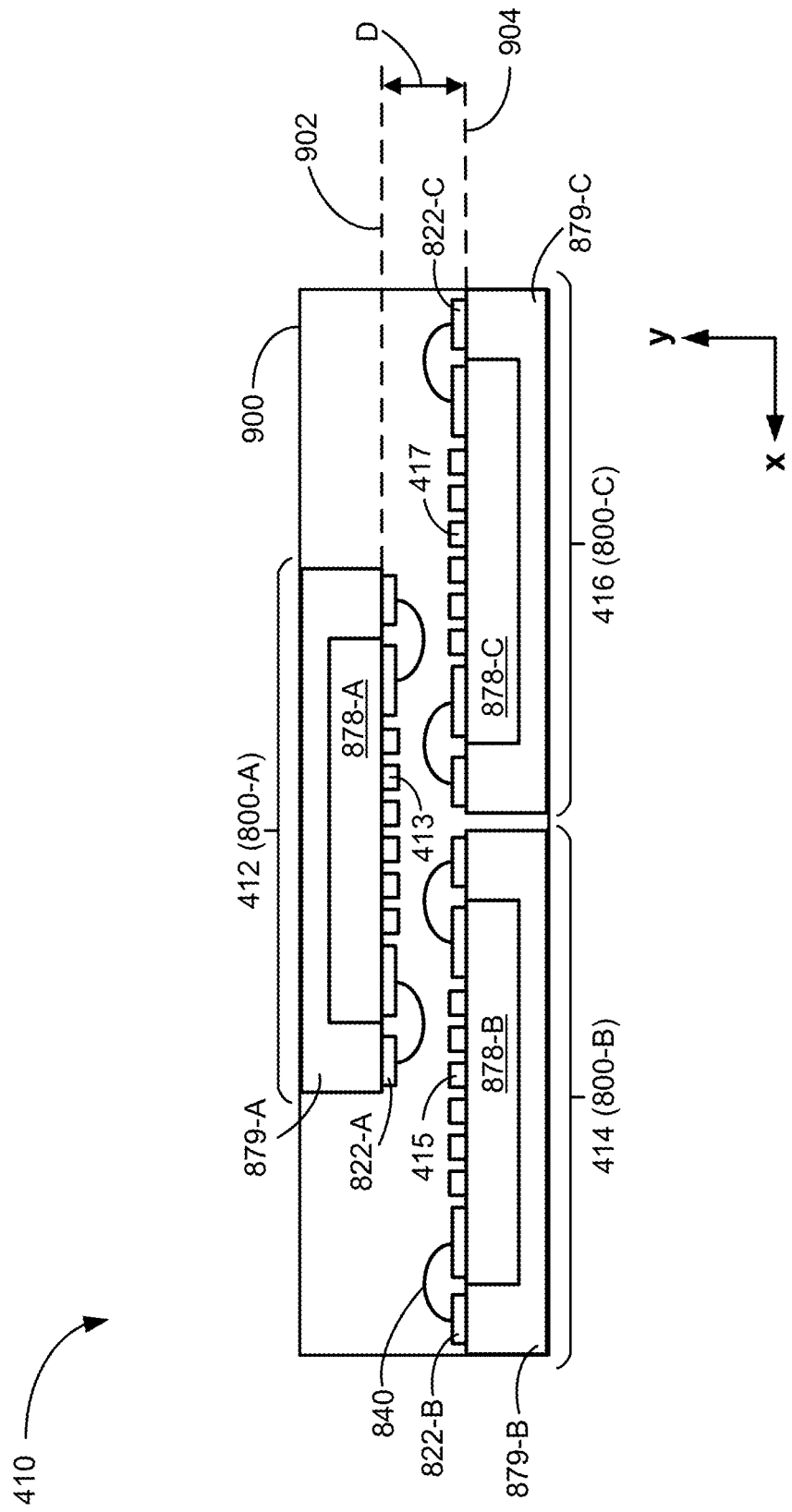
FIGS. 9A-9B illustrate a light source of a display device in accordance with some embodiments.

FIG. 9A illustrates a cross section of light source 410 of display devices 400, in accordance with some embodiments. In some embodiments, as shown, light source 410 includes source elements packages 412, 414, and 416 enclosed in or attached to a housing or frame 900. Each source element package 412, 414, or 416 corresponds to a respective source element package 800 described above with respect to FIGS. 8A-8C (e.g., first source element package 412 corresponds to first source element package 800-A, second source element package 414 corresponds to second source element package 800-B, and third source element package 416 corresponds to third source element package 800-C).

Thus, in some embodiments, light source 410 includes a plurality of source element packages 800 (e.g., first source element package 800-A, second source element package 800-B, and third source element package 800-C). In some embodiments, more than one source element packages (e.g., second and third source element packages 800-A and 800-B) may be disposed side-by side such that their respective top surfaces are substantially along a same lateral plane (e.g., plane 904). In some embodiments, first source element package 800-A is flipped over with respect to source element packages 800-A and 800-B such that a first top surface of the first substrate source element package 800-A faces a top surface of second source element package 800-B and a third top surface of third source element package 800-C. In some embodiments, the first source element package 800-A is positioned such that the first top surface of first source element package 800-A is disposed along a first lateral plane 902. First lateral plane 902 is spaced apart from second lateral plane 904 by distance D in order to accommodate at least some of source elements 413 of the first source element package 412, at least some of source elements 415 of the second source element package 414, at least some of source elements 417 of the third source element package 416, and the bond wires of each of the source element packages 412, 414, and 416, between the first lateral plane 902 and second lateral plane 904.

In some embodiments, first lateral plane 902 is substantially parallel (e.g., forms an angle less than 1 degree) to second lateral plane 904. When the two first and second lateral planes, 902 and 904, are substantially parallel to one another, the top surfaces of source element packages that face one another are also substantially parallel with one another. In some embodiments, distance D is a predetermined distance that is configured to compensate for chromatic dispersion. In some embodiments, distance D is less than 600 micrometers, 500 micrometers, 400 micrometers, 300 micrometers, or 200 micrometers. In some embodiments, distance D is greater than 0.1 micrometers, 0.5 micrometers, 1 micrometer, 2 micrometers, 3 micrometers, 4 micrometers, 5 micrometers, 10 micrometers, 15 micrometers, or 20 micrometers. Distance D between first lateral plane 902 and second lateral plane 904 has a minimum separation to accommodate bond wires 840 of the first source element package 800-A, the second source element package 800-B, and the third source element package 800-C.

In some embodiments, first source element package 800-A is offset laterally (e.g., along the x-direction, along a width direction of the source element packages 800-A, 800-B and 800-C) with respect to source element package 800-B and source element package 800-C, so that the minimum separation requirements are further reduced, resulting in more compactly arrange source element packages (e.g., source element packages 800-A, 800-B, and 800-C) in housing or frame 900.

In some embodiments, first source element package 800-A, corresponding to first source element package 412, is configured to output light in a first spectral range (e.g., corresponding to red light), second source element package 800-B, corresponding to second source element package 414, is configured to output light in a second spectral range (e.g., corresponding to red light green light), and third source element package 800-C, corresponding to third source element package 416, is configured to output light in a third spectral range (e.g., corresponding to red light blue light). In some embodiments, the relative position between the source elements is based on a predetermined configuration (e.g., predefined arrangement). In some embodiments, the predetermined configuration of the source elements is configured to compensate for chromatic dispersion.

In some embodiments, light source 410 may include only two source element packages 800 that are disposed side-by side such that their respective top surfaces are substantially along a same lateral plane (e.g., plane 904). For example, light source 410 may include second source element package 800-B and third source element package 800-C without including first source element package 800-A. Alternatively, light source 410 may include only two source element packages 800 that each have respective top surfaces that are disposed substantially along different lateral planes (e.g., planes 902 and 904). For example, light source 410 may include first source element package 800-A and second source element package 800-B without including third source element package 800-C. In such cases, the two source element packages may be offset from one another (along the x-direction, as shown) or may be stacked directly on top of one another (e.g., without an offset in the x-direction, not shown).

Figure 9B:
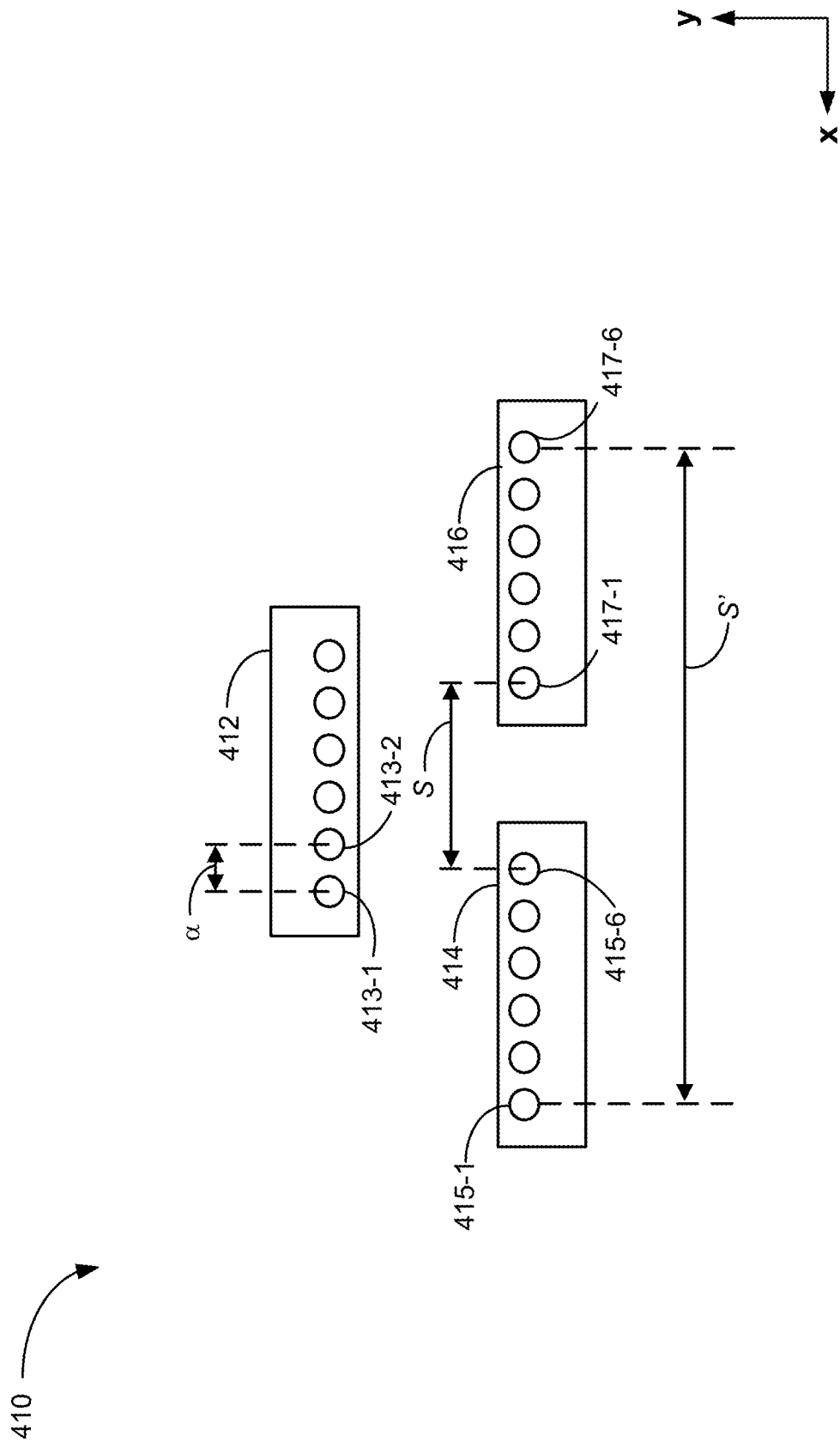

FIG. 9B illustrates light source 410 in accordance with some embodiments. Details of light source 410 that are described above with respect to FIG. 9A are not repeated for brevity.

Distance α refers to a distance between two adjacent source elements of a same source element package (e.g., source element 413-1 and 413-2 of first source element package 412). When source elements are sLEDs, distance α corresponds to distance d (shown in FIG. 8B). In some embodiments, distance α is a predetermined distance. In some embodiments, distance α is determined by the minimum separation required between two adjacent sLEDs, as discussed above with respect to FIG. 8C.

In some embodiments, distance S between two adjacent source elements that belong to different sets of source elements (e.g., source element 415-6 of second source element package 414 and source element 417-1 of third source element package 416) is a predetermined distance.

Distance S' is a maximum distance between two source elements that each belong to different sets of source elements that are not adjacent (e.g., source element 415-1 of second source element package 414 and source element 417-6 of third source element package 416). In some embodiments, distance S' is a predetermined distance that allows light emitted from light source 410 to be efficiently (e.g., with low loss) received by light conditioning assembly 420.

Distance S is a distance between two adjacent source element packages on a same lateral plane. In some embodiments, distance S is a predetermined distance that depends on distance S' so that light emitted from light source 410 can be efficiently (e.g., with low loss) received by light conditioning assembly 420.

Figure 10B:
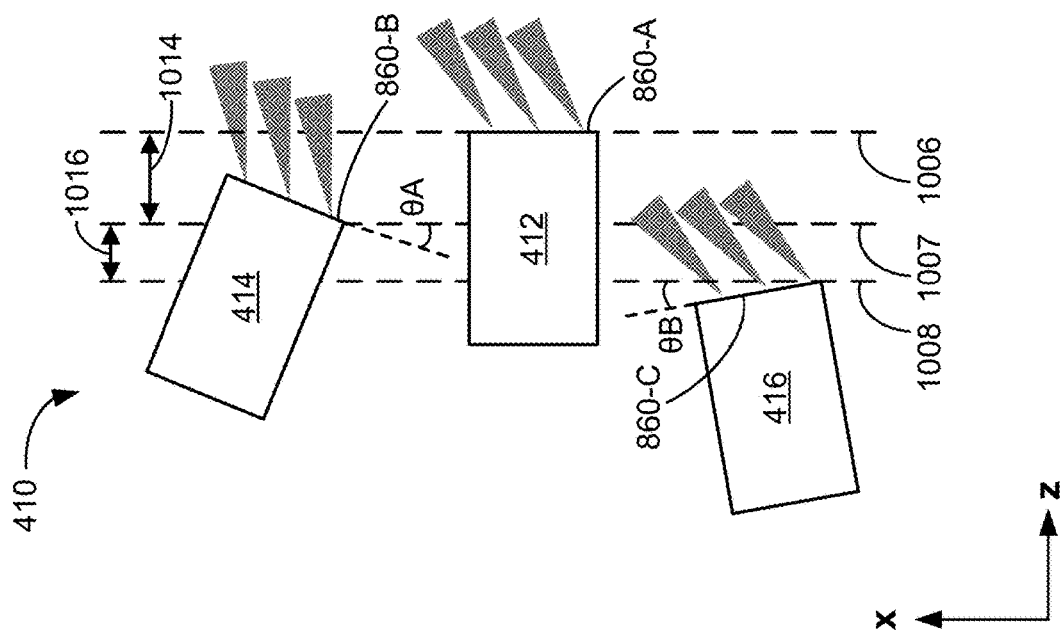
FIGS. 10A-10B show top views of a light source in accordance with some embodiments.
Figure 10A:
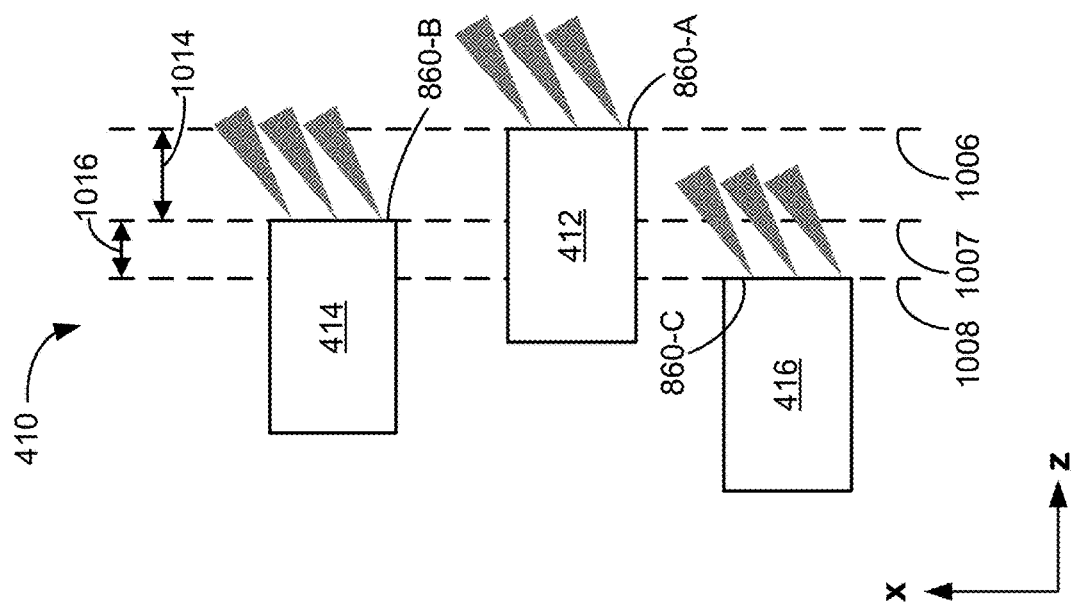

FIGS. 10A and 10B show top views of light source 410 in accordance with some embodiments. Source element packages are shown spaced apart in FIGS. 10A and 10B for ease of illustration. Details of light source 410 that are described above are not repeated here for brevity. In some embodiments, different source element packages of light source 410 may each be disposed (e.g., arranged) along different axial planes. For example, FIG. 10A shows first emission surface 860-A of first source element package 412 disposed along a first axial plane 1006, second emission surface 860-B of second source element package 414 disposed along a second axial plane 1007, and third emission surface 860-C of third source element package disposed along a third axial plane 1008. The first axial plane 1006 is spaced apart from the second axial plane 1007 by distance 1014 and the second axial plane 1007 is spaced apart from the third axial plane 1008 by distance 1016. In some cases, the separation between the axial planes (e.g., distances 1014 and 1016) is on the order of micrometers.

In some embodiments, as shown in FIG. 10B, one or more of first second source element package 412, second source element package 414, and third source element package may be angled along the x-direction such that a respective emission surface of a respective source element package forms an angle with a respective axial plane. For example, first source element package 412, is arranged such that an emission surface of first source element package 412 is disposed along and substantially parallel (e.g., forming an angle less than 1 degree) to first axial plane 1006. In contrast, second source element package 414 may be arranged such that second emission surface 860-B forms an angle θA (e.g., angle θA is between 0 and 90 degrees) with second axial plane 1007 (e.g., second emission surface 860-B is non-parallel and non-perpendicular to second axial plane 1007). Additionally, third source element package 416 may be arranged such that third emission surface 860-C forms an angle θB (e.g., angle θB is between 0 and 90 degrees) with third axial plane 1008 (e.g., third emission surface 860-C is non-parallel non-perpendicular to third axial plane 1008).

Figure 10D:
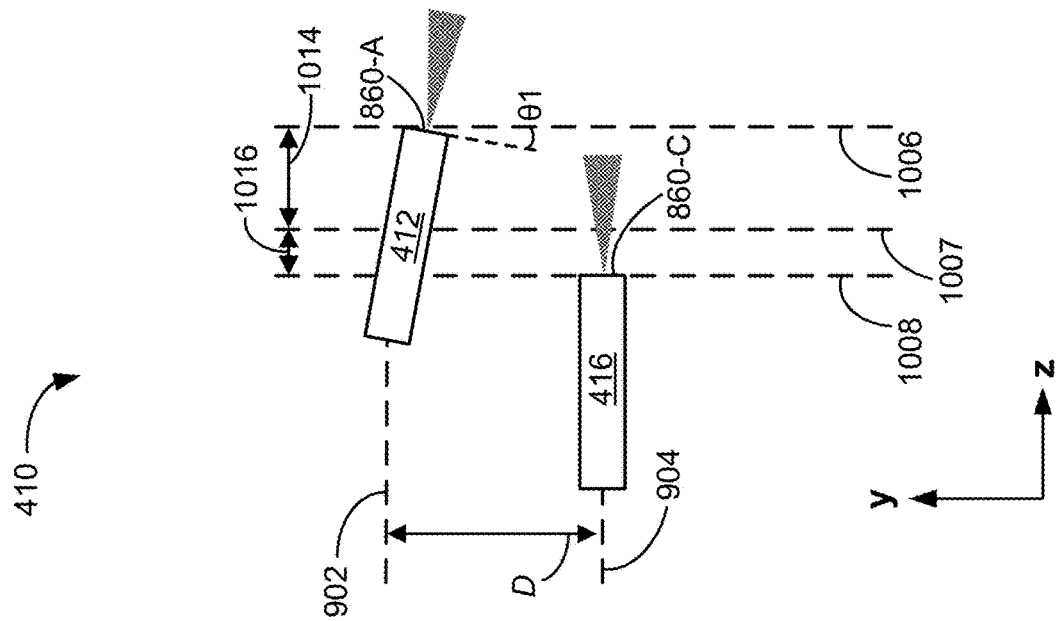
FIGS. 10C-10D show side views of a light source in accordance with some embodiments.
Figure 10C:
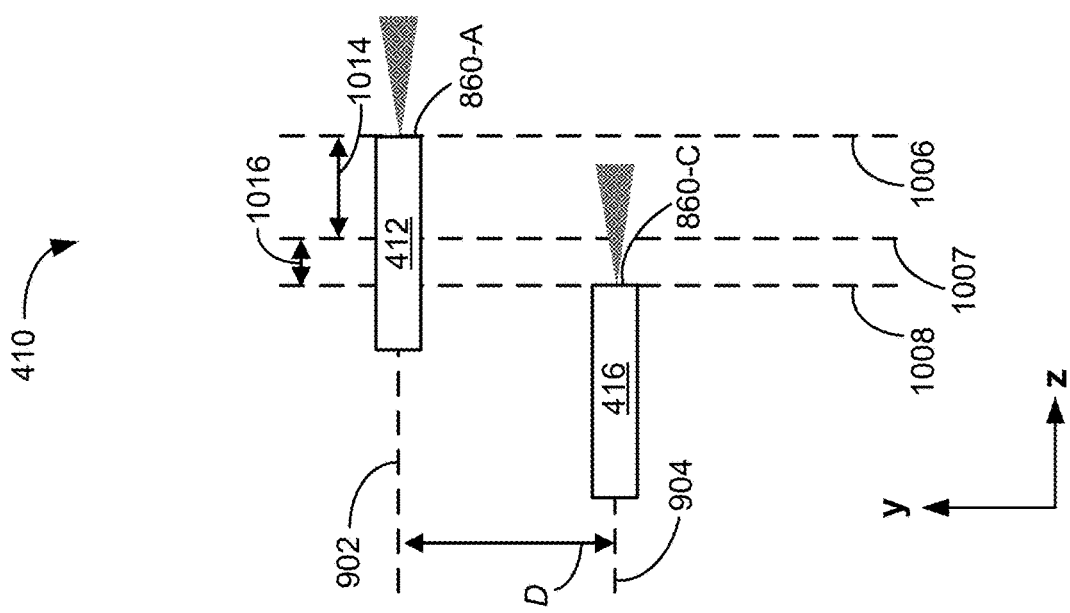

FIGS. 10C and 10D show side views of light source 410 in accordance with some embodiments. Source element packages are shown spaced apart in FIGS. 10C and 10D for ease of illustration. Second source element package 414 is not shown in FIGS. 10C and 10D for ease of illustration.

In some embodiments, one or more of first source element package 412, second source element package 414, and third source element package may be angled along the y-direction. For example, as shown in FIG. 10D, third source element package 416, disposed along third axial plane 1008 and second lateral plane 904, is arranged such that third emission surface 860-C of third source element package 416 is substantially parallel to third axial plane 1008. In contrast, first source element package 412, disposed along first axial plane 1006 and first lateral plane 902, is arranged such that first emission surface 860-A forms an angle θ1 (e.g., angle θ1 is between 0 and 90 degrees) with first axial plane 1006 (e.g., first emission surface 860-A is non-parallel non-perpendicular to first axial plane 1006).

Figure 11A:
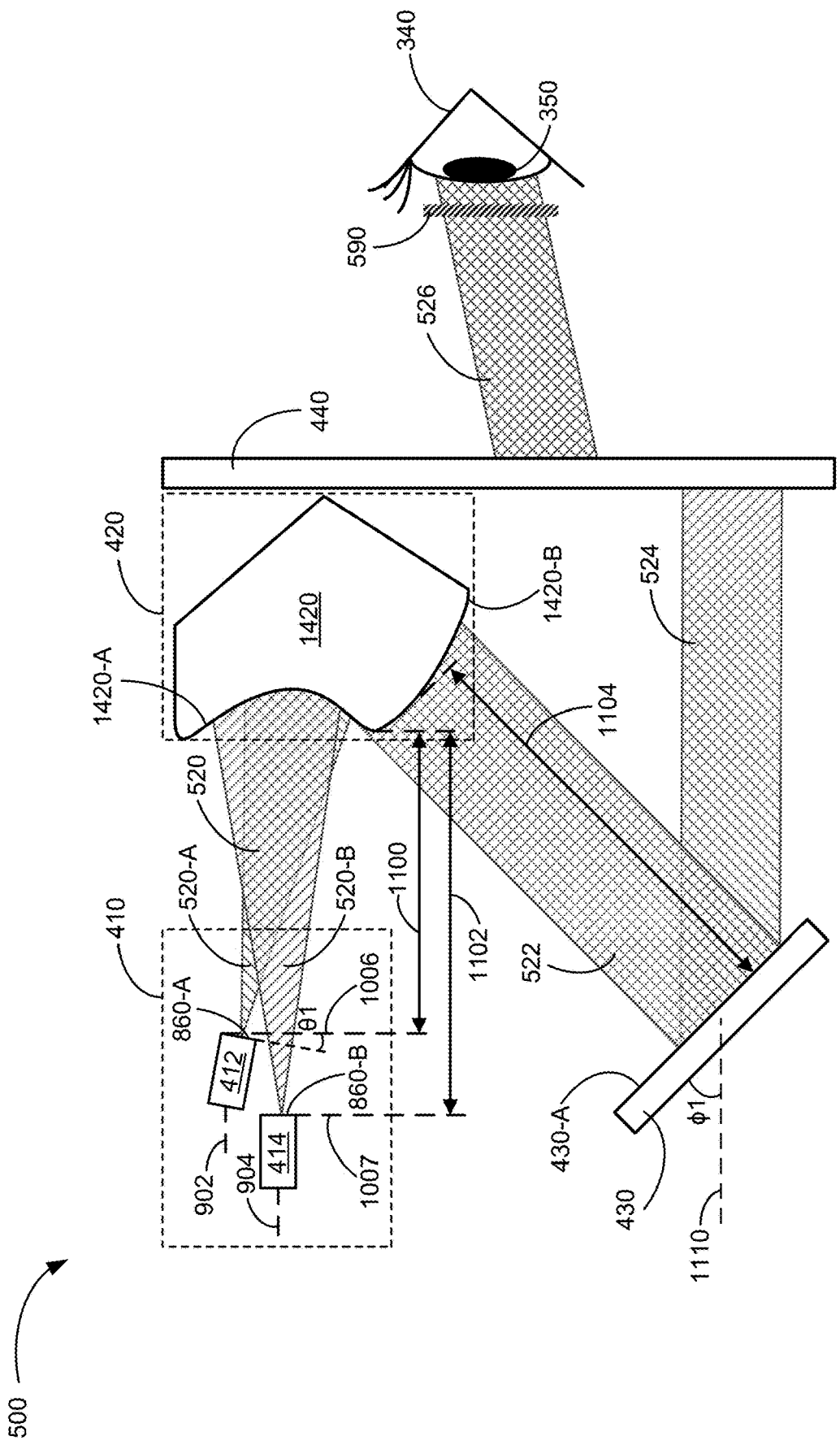
FIGS. 11A and 11B illustrate operation of a display device in accordance with some embodiments.
Figure 11B:
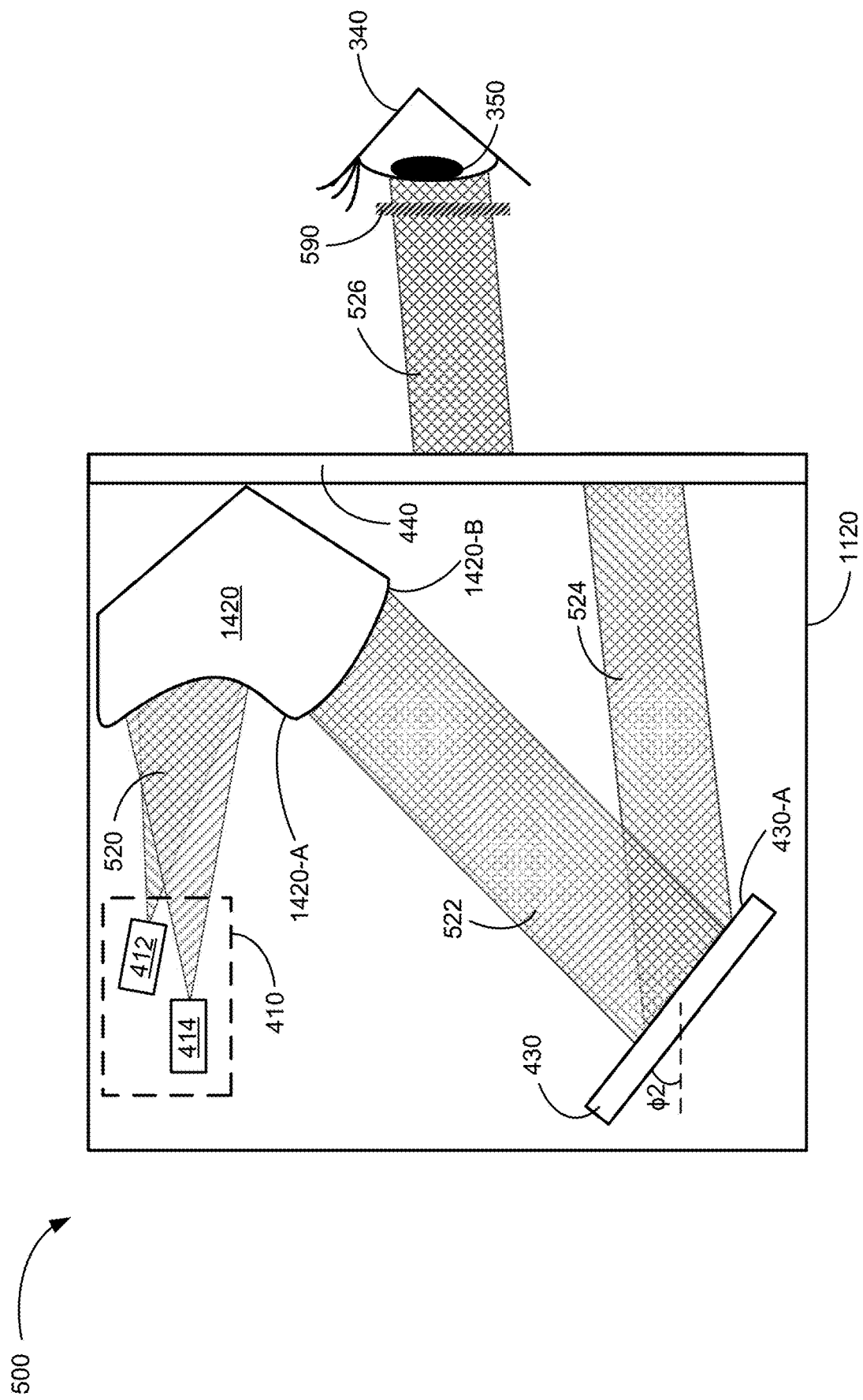

FIGS. 11A and 11B illustrate a detailed illustration of display device 500 in accordance with some embodiments. Details regarding display device 500 that are described above with respect to FIG. 5 are not repeated here for brevity.

Display device 500 includes light source 410, light conditioning assembly 420, scanning assembly 430, and output device 440. In some embodiments, as shown in FIG. 11B, display device 500 may be enclosed in a frame or housing 1120.

Light source 410 includes first source element package 412, disposed along first lateral plane 902 and first axial plane 1006, and second source element package 414, disposed along second lateral plane 904 and second axial plane 1007. Light conditioning assembly 420 includes optical element 1420 having first surface 1420-A and second surface 1420-B. The first axial plane 1006 and second axial plane 1007 are spaced apart from a representative position on first surface 1420-A of light conditioning assembly 420 by distance 1100 and distance 1102, respectively. In some embodiments, a distance (e.g., distances 1100, 1102) between light source 410 and first surface 1420-A of light conditioning assembly 420 is equivalent to an effective focal length of light conditioning assembly 420.

Scanning assembly 430 includes surface 430-A, which is spaced apart from a representative position on second surface 1420-B of scanning assembly 430 by distance 1104. In some embodiments, distance 1104 is a predetermined distance. In some embodiments, distance 1104 is equivalent to an effective focal length of light conditioning assembly 420. In some embodiments, scanning assembly 430 has an aperture or a stop. In some embodiments, when distances 1100 or 1102 and distance 1104 correspond to a focal length of light conditioning assembly 420 and scanning assembly 430 includes an aperture or a stop, light conditioning assembly 420 and scanning assembly 430 may collectively form an assembly (e.g., optical assembly, apparatus) that is telecentric.

Light source 410 is configured to output image light 520, having a first divergence, towards a first surface 1420-A of light conditioning assembly 420. Image light 520 includes light 520-A, output from first source element package 412, and light 520-B, output from second source element package 414. In some embodiments, light 520-A has a wavelength in a first spectral range (e.g., corresponding to red light), and light 520-B has a wavelength in a second spectral range (e.g., corresponding to red light green light) that is distinct from the first spectral range. Thus, image light 520 includes light having more than one wavelength. Although only two source element packages are shown in FIG. 11A, light source 410 may include any number of source element packages and image light 520 may include a plurality of wavelength ranges beyond the wavelengths ranges described.

First surface 1420-A is configured to receive image light 520 having a first divergence and second surface 1420-B is configured to output conditioned light 522 having a second divergence that is distinct from the first divergence. In some embodiments, the second divergence is smaller than the first divergence. In some embodiments, light conditioning assembly 420 is configured to compensate for the relative arrangement of the source elements of light source 410.

Scanning assembly 430 is configured to receive conditioned light 522 incident upon surface 430-A of scanning assembly 430 from a first direction and to output steered light 524 in a second direction that is different from the first direction such that steered light 524 is coupled into output device 440.

Output device 440 is configured to receive steered light 524 and direct output light 526, corresponding to steered light 524, toward eyebox 590. Thus, image light 520, output from light source 410 and corresponding to one or more images, is transmitted to eyebox 590 as output light 526, displaying the one or more images.

The direction of propagation of steered light 524 determines the direction of propagation of output light 526. For example, FIG. 11A shows scanning assembly 430 disposed at a first angle ϕ1 relative to a reference axis 1110. When disposed at first angle ϕ1, scanning assembly 430 is configured to redirect conditioned light 522 as steered light 524 in a third direction such that output light 526 is output from the waveguide in a fourth direction. In contrast, FIG. 11B shows scanning assembly 430 disposed at a second angle ϕ2 relative to a reference axis 1110. When disposed at first angle ϕ2, scanning assembly 430 is configured to redirect conditioned light 522 as steered light 524 in a fifth direction, different from the third direction, such that output light 526 is output from the waveguide in a sixth direction that is different from the fourth direction.

Figure 12A:
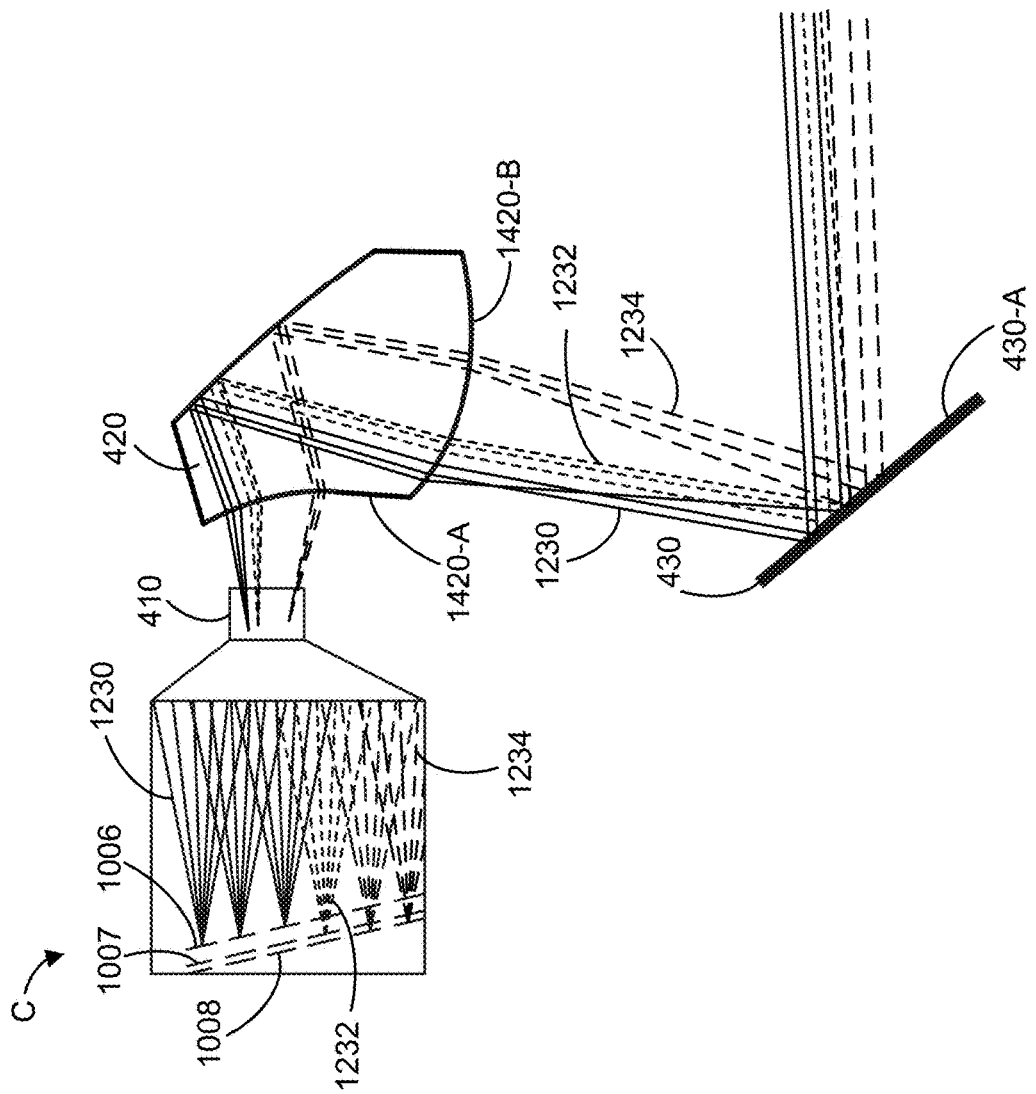
FIG. 12A illustrates optical paths of light propagating in a display device in accordance with some embodiments.
Figure 12B:
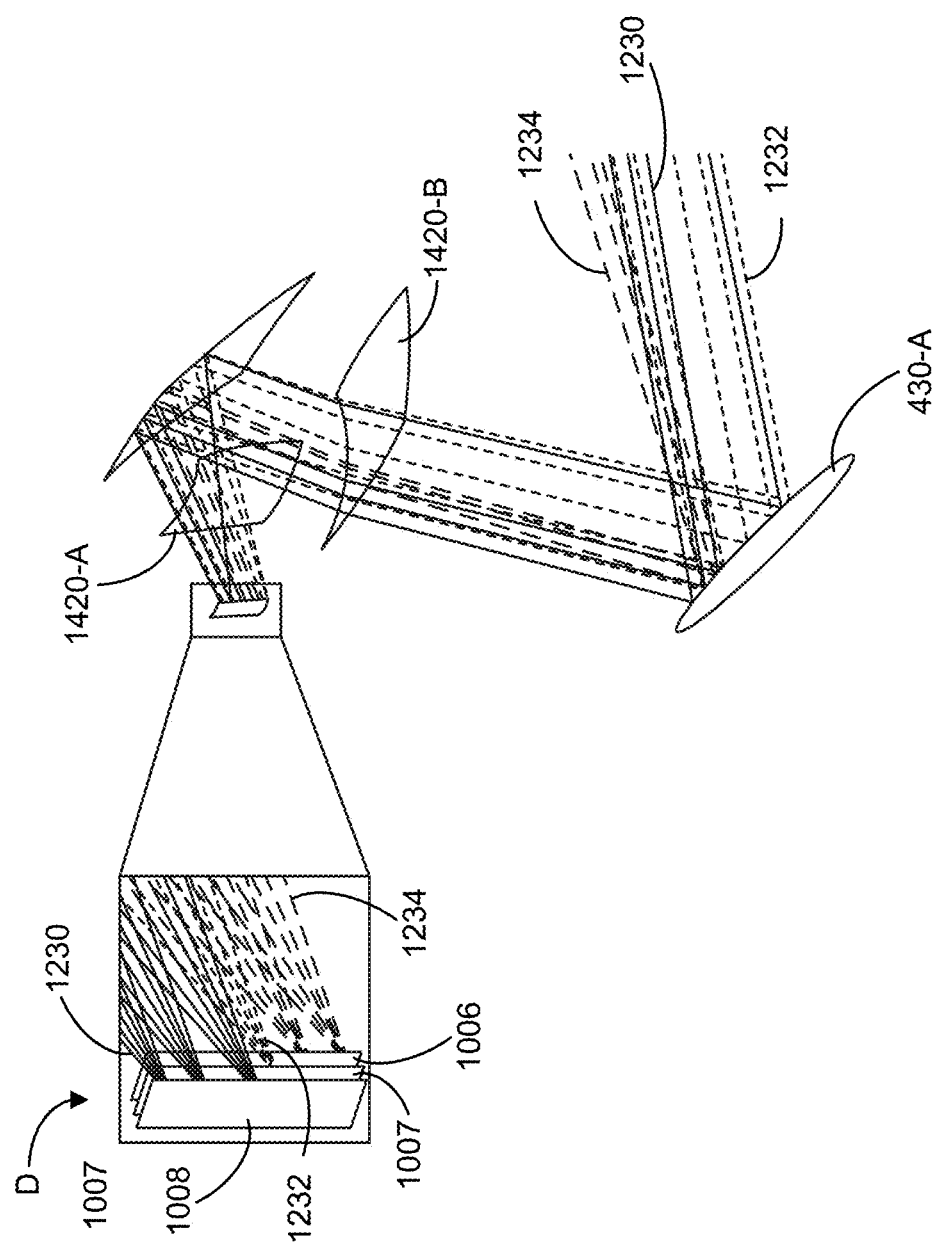
FIG. 12B illustrates a perspective view of optical paths of light propagating in a display device in accordance with some embodiments.

FIGS. 12A-12B illustrate a side view and a perspective view, respectively, of optical paths of light propagating in display device 500 in accordance with some embodiments. As shown, light source 410 includes a plurality of source elements, each emitting light having a different wavelength range (e.g., different color range). Inset C of FIG. 12A and inset D of FIG. 12B both show the relative position of source elements in light source 410 (e.g., first set of source elements is disposed along first axial plane 1006, second set of source elements is disposed along second axial plane 1007, and third set of source elements is disposed along third axial plane 1008). The optical path of light emitted from the first set of source elements is shown as solid lines 1230, corresponding to light having a first wavelength range. The optical path of light emitted from the second set of source elements is shown as short dashes 1232, corresponding to light having a second wavelength range that is different from the first wavelength range. The optical path of light emitted from the third set of source elements is shown as dashed lines 1234, corresponding to light having a third wavelength range that is different from each of the first and the second wavelength ranges.

As shown, light source 410 outputs diverging light towards first surface 1420-A of optical element 1420. First surface 1420-A receives the diverging light and optical element 1420 outputs conditioned light from second surface 1420-B towards scanning assembly 430 such that the conditioned light steered by scanning assembly 430 and output as steered light that is substantially collimated.

Figure 13B:
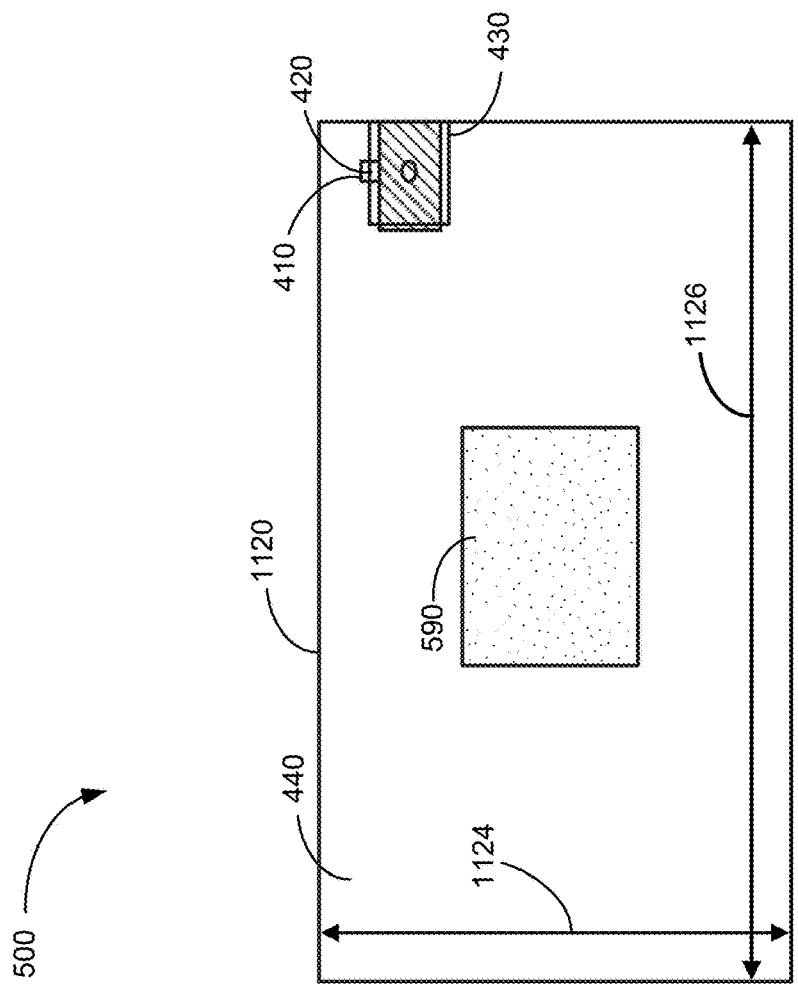
FIG. 13A-13B illustrate side views of a display device in accordance with some embodiments.
Figure 13A:
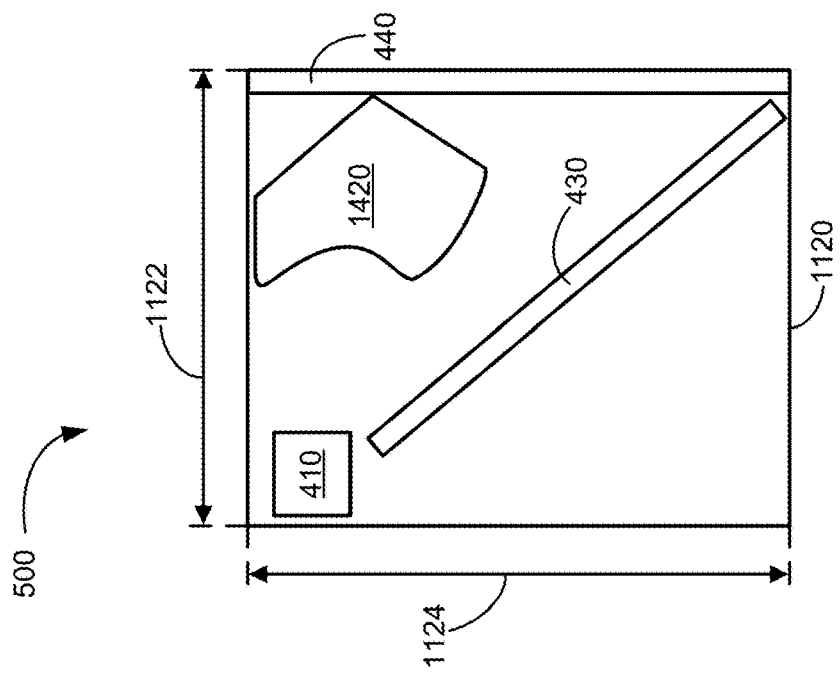

FIGS. 13A and 13B illustrate side views of display device 500 in accordance with some embodiments. Details regarding display device 500 that are described above are not repeated here for brevity.

In some embodiments, as shown, display device 500 is enclosed in housing 1120 that has a first dimension 1122, a second dimension 1124, and a third dimension 1126.

Distances (e.g., spacing) and dimensions described refer to values corresponding to the currently available technology. As components (such as light sources and scanning devices such as MEMs) become available in smaller dimensions, the dimensions and distances described can also be reduced. The devices and methods described will also work with smaller dimensions and distances.

In light of these principles, we now turn to certain embodiments of a display device.

In accordance with some embodiments, a light source (e.g., light source 410) for projecting images includes a first set of source elements (e.g., first set of source elements 413) and a second set of source elements (e.g., second set of source elements 415). The first set of source elements are disposed on a first substrate (e.g., first package substrate 879-A) and electrically coupled to a first set of circuit pads (e.g., circuit pads 822-A) formed on a first top surface (e.g., top surface 802) of the first substrate by respective first bond wires (e.g., bond wires 840). The second set of source elements are disposed on a second substrate (e.g., second package substrate 879-B) and electrically coupled to a second set of circuit pads (e.g., circuit pads 822-B) formed on a second top surface (e.g., top surface 802) of the second substrate by respective second bond wires. At least a first portion of the first top surface and at least a portion of the second top surface face each other.

In some embodiments, at least a first portion of the first top surface and at least a portion of the second top surface face are spaced apart from each other (e.g., by distance D) to accommodate at least some of the first set of source elements, at least some of the second set of source elements, and at least some of the first and second bond wires.

In some embodiments, the first top surface of the first substrate is disposed along a first lateral plane (e.g., first lateral plane 902) and the second top surface of the second substrate is disposed along a second lateral plane (e.g., second lateral plane 904). The first lateral plane and the second lateral plane are spaced apart by distance D.

In some embodiments, the light source also includes a third set of source elements (e.g., third set of source elements 417) disposed on a third substrate (e.g., third package substrate 879-C) and electrically coupled to a third set of circuit pads (e.g., circuit pads 822-C) formed on a third top surface (e.g., top surface 802) of the third substrate by respective third bond wires (e.g., bond wires 840). At least a second portion of the first top surface and at least a portion of the third top surface face each other and are spaced apart from each other to accommodate at least some of the first set of source elements, at least some of the third set of source elements, and at least some of the first and third bond wires.

In some embodiments, the third top surface of the third substrate is disposed along the second lateral plane (e.g., second lateral plane 904).

In some embodiments, the first substrate (e.g., first package substrate 879-A) and the second substrate (e.g., second package substrate 879-B) are offset laterally from each other such that a distance (e.g., distance D) between the first top surface and the second top surface is no greater than 200 micrometers.

In some embodiments, the first set of source elements (e.g., first set of source elements 413) is configured to output light having a first spectral range and the second set of source elements (e.g., second set of source elements 415) is configured to output light having a second spectral range that is distinct from the first spectral range. In some embodiments, the third set of source elements (e.g., third set of source elements 417) is configured to output light having a third spectral range that is distinct from the first spectral range and the second spectral range.

In some embodiments, the first set of source elements (e.g., first set of source elements 413) has a first emission surface (e.g., first emission surface 860-A) and the second set of source elements (e.g., second set of source elements 415) has a second emission surface (e.g., second emission surface 860-B) that is offset from the first emission surface along a normal direction (e.g., along the z-direction, along the length direction) of the first or the second emission surface.

In some embodiments, the third set of source elements (e.g., third set of source elements 417) has a third emission surface (e.g., third emission surface 860-C) that is offset from at least one of the first emission surface or the second emission surface along a normal direction (e.g., along the z-direction, along the length direction) of the first or the second emission surface.

In some embodiments, the first set of source elements (e.g., first set of source elements 413) are disposed along a first axial plane (e.g., first axial plane 1006), the second set of source elements (e.g., second set of source elements 415) are disposed along the second axial plane (e.g., second axial plane 1007), and the third set of source elements (e.g., third set of source elements 417) are disposed along a third axial plane (e.g., third axial plane 1008).

In some embodiments, the first set of source elements (e.g., first set of source elements 413) has a first emission surface (e.g., first emission surface 860-A) and the second set of source elements (e.g., second set of source elements 415) has a second emission surface (e.g., second emission surface 860-B) that that forms an acute angle with the first emission surface (e.g., angle θA or angle θ1 is between 0 degrees and 90 degrees).

In some embodiments, the third set of source elements (e.g., third set of source elements 417) has a third emission surface (e.g., third emission surface 860-C that that forms an acute angle with the first emission surface.

In some embodiments, source elements of the first set of source elements (e.g., first set of source elements 413), the second source elements (e.g., second source elements 415), and the third source elements (e.g., third source elements 417) are one of super luminescent light emitting diodes, or lasers (e.g., edge-emitting lasers, multi-ridge lasers, vertical cavity surface emitting laser).

In some embodiments, source elements of the first set of source elements (e.g., first set of source elements 413), the second source elements (e.g., second source elements 415), and the third source elements (e.g., third source elements 417) are edge emitting devices.

In accordance with some embodiments, a display device (e.g., display device 400, 500) for displaying images includes a light source (e.g., light source 410) configured to output image light (e.g., image light 520) and an optical assembly (e.g., light conditioning assembly 420) configured to receive the image light output from the light source. The image light having a first divergence profile. The optical assembly is also configured to output the image light such that the output image light (e.g., conditioned light 522) has a second divergence profile that is different from the first divergence profile. The light source includes a first set of source elements (e.g., first set of source elements 413) and a second set of source elements (e.g., second set of source elements 415). The first set of source elements are disposed on a first substrate (e.g., first package substrate 879-A) and electrically coupled to a first set of circuit pads (e.g., circuit pads 822) formed on a first top surface (e.g., top surface 802) of the first substrate by respective first bond wires (e.g., bond wires 840). The second set of source elements are disposed on a second substrate (e.g., second package substrate 879-B) and electrically coupled to a second set of circuit pads formed on a second top surface of the second substrate by respective second bond wires. At least a first portion of the first top surface and at least a portion of the second top surface face each other and are spaced apart from each other (e.g., by distance D) to accommodate at least some of the first set of source elements, at least some of the second set of source elements, and at least some of the first and second bond wires.

In some embodiments, at least a first portion of the first top surface and at least a portion of the second top surface are spaced apart from each other (e.g., by distance D) to accommodate at least some of the first set of source elements, at least some of the second set of source elements, and at least some of the first and second bond wires.

In some embodiments, the light source (e.g., light source 410) also includes a third set of source elements (e.g., third set of source elements 417) disposed on a third substrate (e.g., third package substrate 879-C) and electrically coupled to a third set of circuit pads (e.g., circuit pads 822) formed on a third top surface (e.g., top surface 802) of the third substrate by respective third bond wires (e.g., bond wires 840). At least a second portion of the first top surface and at least a portion of the third top surface face each other and are spaced apart from each other to accommodate at least some of the first set of source elements, at least some of the third set of source elements, and at least some of the first and third bond wires.

In some embodiments, the first substrate (e.g., first package substrate 879-A) and the second substrate (e.g., second package substrate 879-B) are offset laterally from each other such that a distance (e.g., distance D) between the first top surface and the second top surface is no greater than 200 micrometers.

In some embodiments, the first set of source elements (e.g., first set of source elements 413) is configured to output light having a first spectral range and the second set of source elements (e.g., second set of source elements 415) is configured to output light having a second spectral range that is distinct from the first spectral range. In some embodiments, the third set of source elements (e.g., third set of source elements 417) is configured to output light having a third spectral range that is distinct from the first spectral range and the second spectral range.

In some embodiments, the first set of source elements (e.g., first set of source elements 413) has a first emission surface (e.g., first emission surface 860-A) and the second set of source elements (e.g., second set of source elements 415) has a second emission surface (e.g., second emission surface 860-B) that is offset from the first emission surface along a normal direction (e.g., along the z-direction, along the length direction) of the first or the second emission surface.

In some embodiments, the optical assembly (e.g., light conditioning assembly 420) includes an optical element (e.g., optical element 1420) that includes a non-symmetric surface (e.g., first surface 1420-A has a non-symmetric surface profile).

In some embodiments, the optical element (e.g., light conditioning assembly 420) further includes a first surface (e.g., first surface 1420-A) that is configured to receive the image light (e.g., image light 520) output from the light source and having the first divergence profile. The optical element also includes a second surface (e.g., second surface 1420-B) configured to output the image light (e.g., conditioned light 522) having the second divergence profile. In some embodiments, the second divergence is smaller than the first divergence.

In some embodiments, the display device (e.g., display device 400, 500) further includes a scanning assembly (e.g., scanning assembly 430) configured to receive image light (e.g., image light 520) output from the optical assembly (e.g., light conditioning assembly 420) in a first direction and steer the image light in second direction that is different from the first direction.

In some embodiments, the scanning assembly (e.g., scanning assembly 430) includes a deformable optical element (e.g., MEMs, deformable mirror).

In some embodiments, the display device (e.g., display device 400, 500) further includes a waveguide (e.g., output device 440) that has an input coupler and an output coupler. The waveguide is configured to receive image light (e.g., steered light 524) output from the scanning assembly (e.g., scanning assembly 430) at the input coupler. The waveguide is also configured to transmit the image light along the waveguide and to output the image light (e.g., as output light 526) at the output coupler.

In some embodiments, the scanning assembly is configured to steer the light such that the light is coupled into the waveguide. The scanning assembly is configured to steer the light, at a first time, in a third direction such that the light is output from the waveguide in a fourth direction. The scanning assembly is also configured to steer the light, at a second time, in a fifth direction different from the third direction, such that the light is output from the waveguide in a sixth direction different from the fourth direction.

In some embodiments, source elements (e.g., source elements 413, 415, 417) of the light source (e.g., light source 410) are arranged in a predetermined spatial configuration to compensate for chromatic dispersion of the optical assembly (e.g., light conditioning assembly 420).

In some embodiments, the optical assembly (e.g., light conditioning assembly 420) is configured to compensate for the spatial configuration of the source elements (e.g., source elements 413, 415, 417) of the light source (e.g., light source 410).

In some embodiments, the source elements (e.g., source elements 413, 415, 417) of the light source (e.g., light source 410) are spaced apart by a distance (e.g., distance α, distance S) that is equal to or less than 25 micrometers (e.g., distance α and/or distance S is equal to or less than 25 micrometers). For example, source elements 413-1 and 413-2 are spaced apart by distance α and distance α is equal to or less than 25 micrometers. In another example, source elements 415-6 and 415-1 are spaced apart by distance S and distance S is equal to or less than 25 micrometers.

In some embodiments, a source element (e.g., source elements 415) of the second set of source elements (e.g., second source element package 414) is spaced apart from a source element (e.g., source elements 417) of the third set of source elements (e.g., second source element package 416) by a distance (e.g., distance S and/or distance 5) that is less than 186 micrometers. For example, source elements 415-1 and 417-6 are spaced apart by distance S', and distance S' is equal to or less than one of 180 micrometers, 181 micrometers, 182 micrometers, 183 micrometers, 184 micrometers, 185 micrometers, 186 micrometers, 187 micrometers, 188 micrometers, 189 micrometers, or 190 micrometers. In another example, source elements 415-6 and 417-1 are spaced apart by distance S and distance S is equal to or less than one of 180 micrometers, 181 micrometers, 182 micrometers, 183 micrometers, 184 micrometers, 185 micrometers, 186 micrometers, 187 micrometers, 188 micrometers, 189 micrometers, or 190 micrometers.

In some embodiments, the display apparatus (e.g., display device 400, display device 500, housing 1120) has a first dimension (e.g., first dimension 1122), a second dimension (e.g., second dimension 1124), and a third dimension (e.g., third dimension 1126), each of which is less than one of 10 millimeters, 9 millimeters, 8 millimeters, 7 millimeters, 6 millimeters, or 5 millimeters.

Although various drawings illustrate operations of particular components or particular groups of components with respect to one eye, a person having ordinary skill in the art would understand that analogous operations can be performed with respect to the other eye or both eyes. For brevity, such details are not repeated herein.

Although some of various drawings illustrate a number of logical stages in a particular order, stages which are not order dependent may be reordered and other stages may be combined or broken out. While some reordering or other groupings are specifically mentioned, others will be apparent to those of ordinary skill in the art, so the ordering and groupings presented herein are not an exhaustive list of alternatives. Moreover, it should be recognized that the stages could be implemented in hardware, firmware, software or any combination thereof.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A display device for displaying images, the display device comprising:
    a light source configured to output image light, the light source including:
        a first set of multiple source elements, on a first substrate, electrically coupled to a first set of circuit pads formed on a first top surface of the first substrate by respective first bond wires; and
        a second set of multiple source elements, on a second substrate, electrically coupled to a second set of circuit pads formed on a second top surface of the second substrate by respective second bond wires, wherein
        at least a first portion of the first top surface and at least a portion of the second top surface face each other;
        the first portion of the first top surface is located directly above or below the portion of the second top surface facing the first portion of the first top surface; and
        the first substrate and the second substrate, including the portion of the second top surface facing the first portion of the first top surface and being located above or below the first portion of the first top surface, are partially offset laterally from each other such that the first bond wires and the second bond wires are offset laterally from one another; and
    an optical assembly configured to:
        receive the image light output from the light source, the image light having a first divergence profile; and
        output the image light such that the output image light has a second divergence profile that is different from the first divergence profile.

2. The display device of claim 1, wherein:
the first top surface and the second top surface are spaced apart from each other such that they accommodate at least some of the first set of multiple source elements, at least some of the second set of multiple source elements, and at least some of the first and second bond wires between the first portion of the first top surface and the portion of the second top surface.

3. The display device of claim 2, wherein the light source further comprises:
a third set of multiple source elements, on a third substrate, electrically coupled to a third set of circuit pads formed on a third top surface of the third substrate by respective third bond wires;
at least a second portion of the first top surface and at least a portion of the third top surface face each other and are spaced apart from each other such that they accommodate at least some of the first set of multiple source elements, at least some of the third set of multiple source elements, and at least some of the first and third bond wires between the second portion of the first top surface and the portion of the third top surface;
the second portion of the first top surface is located directly above or below the portion of the third top surface facing the second portion of the first top surface; and
the first substrate and the third substrate, including the portion of the third top surface facing the second portion of the first top surface and being located above or below the second portion of the first top surface, are partially offset laterally from each other such that the first bond wires and the third bond wires are offset laterally from one another.

4. The display device of claim 3, wherein the first substrate, the second substrate, and the third substrate are substantially parallel to one another.

5. The display device of claim 1, wherein the first substrate and the second substrate are offset laterally from each other such that a distance between the first top surface and the second top surface is no greater than 200 micrometers.

6. The display device of claim 1, wherein:
the first set of multiple source elements is configured to output light having a first spectral range; and
the second set of multiple source elements is configured to output light having a second spectral range distinct from the first spectral range.

7. The display device of claim 1, wherein:
the first set of multiple source elements has a first emission surface; and
the second set of multiple source elements has a second emission surface that forms an acute angle with the first emission surface.

8. The display device of claim 1, wherein the optical assembly includes an optical element that includes a non-symmetric surface.

9. The display device of claim 8, wherein the optical element further comprises:
a first surface configured to receive the image light output from the light source and having the first divergence profile; and
a second surface configured to output the image light having the second divergence profile.

10. The display device of claim 1, further comprising:
a scanning assembly configured to receive image light output from the optical assembly in a first direction and steer the image light in a second direction that is different from the first direction.

11. The display device of claim 10, wherein the scanning assembly includes one or more deformable optical elements.

12. The display device of claim 10, further comprising:
a waveguide having an input coupler and an output coupler, wherein the waveguide is configured to:
receive the image light, output from the scanning assembly, at the input coupler;
transmit the image light along the waveguide; and
output the image light at the output coupler.

13. The display device of claim 1, wherein:
the respective first bond wires include a first bond wire having a first distance from a center of the first substrate; and
the respective second bond wires include a second bond wire having a second distance from a center of the second substrate corresponding to the first distance.

14. The display device of claim 13, wherein:
the first bond wires are positioned on the first substrate at such locations that come into contact with the second bond wires on the second substrate when the first substrate and the second substrate are positioned adjacent to each other without partial lateral offset between the first substrate and the second substrate.

15. A light source for projecting images, comprising:
a first set of multiple source elements, on a first substrate, electrically coupled to a first set of circuit pads formed on a first top surface of the first substrate by respective first bond wires; and
a second set of multiple source elements, on a second substrate, electrically coupled to a second set of circuit pads formed on a second top surface of the second substrate by respective second bond wires, wherein:
at least a first portion of the first top surface and at least a portion of the second top surface face each other;
the first portion of the first top surface is located directly above or below the portion of the second top surface facing the first portion of the first top surface; and
the first substrate and the second substrate, including the portion of the second top surface facing the first portion of the first top surface and being located above or below the first portion of the first top surface, are partially offset laterally from each other such that the first bond wires and the second bond wires are offset laterally from one another.

16. The light source of claim 15, wherein:
the first top surface and the second top surface are spaced apart from each other such that they accommodate at least some of the first set of multiple source elements, at least some of the second set of multiple source elements, and at least some of the first and second bond wires between the first portion of the first top surface and the portion of the second top surface.

17. The light source of claim 16, further comprising:
a third set of multiple source elements, on a third substrate, electrically coupled to a third set of circuit pads formed on a third top surface of the third substrate by respective third bond wires, wherein:
at least a second portion of the first top surface and at least a portion of the third top surface face each other and are spaced apart from each other such that they accommodate at least some of the first set of multiple source elements, at least some of the third set of multiple source elements, and at least some of the first and third bond wires between the second portion of the first top surface and the portion of the third top surface;

the second portion of the first top surface is located directly above or below the portion of the third top surface facing the second portion of the first top surface; and the first substrate and the third substrate, including the portion of the third top surface facing the second portion of the first top surface and being located above or below the second portion of the first top surface, are partially offset laterally from each other such that the first bond wires and the third bond wires are offset laterally from one another.

18. The light source of claim 15, wherein the first substrate and the second substrate are offset laterally from each other such that a distance between the first top surface and the second top surface is no greater than 200 micrometers.

19. The light source of claim 15, wherein the first set of multiple source elements and the second set of multiple source elements have a same number of source elements and the first set of multiple source elements are located on respective locations on the first substrate that correspond to locations of the second set of multiple source elements on the second substrate.

20. The light source of claim 15, wherein source elements, of the first set of multiple source elements and the second set of multiple source elements, are edge-emitting devices.

* * * * *